(12) United States Patent
Asami et al.

(10) Patent No.: US 10,770,147 B2
(45) Date of Patent: Sep. 8, 2020

(54) MEMORY SYSTEM INCLUDING A MEMORY DEVICE THAT CAN DETERMINE OPTIMUM READ VOLTAGE APPLIED TO A WORD LINE

(71) Applicant: Toshiba Memory Corporation, Tokyo (JP)

(72) Inventors: Shohei Asami, Yokohama Kanagawa (JP); Toshikatsu Hida, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 147 days.

(21) Appl. No.: 15/446,952

(22) Filed: Mar. 1, 2017

(65) Prior Publication Data
US 2018/0091170 A1 Mar. 29, 2018

(30) Foreign Application Priority Data
Sep. 29, 2016 (JP) .................................. 2016-191391

(51) Int. Cl.
*G11C 16/34* (2006.01)
*G11C 16/26* (2006.01)
*G11C 11/56* (2006.01)
*G11C 29/02* (2006.01)
*G11C 29/52* (2006.01)
(Continued)

(52) U.S. Cl.
CPC .......... *G11C 16/26* (2013.01); *G11C 11/5642* (2013.01); *G11C 16/3418* (2013.01); *G11C 29/028* (2013.01); *G11C 16/0483* (2013.01); *G11C 29/52* (2013.01); *G11C 2029/1202* (2013.01); *H03M 13/1102* (2013.01); *H03M 13/152* (2013.01); *H03M 13/1515* (2013.01)

(58) Field of Classification Search
CPC ... G11C 16/26; G11C 29/028; G11C 16/3418; G11C 11/5642; G11C 2029/1202; G11C 16/0483; G11C 29/52; H03M 13/1102; H03M 13/1515; H03M 13/152
USPC ......................................................... 714/773
See application file for complete search history.

(56) References Cited

U.S. PATENT DOCUMENTS 6,973,003 B1 * 12/2005 Salleh ................... G11C 11/406
365/189.05
7,808,831 B2   10/2010 Mokhlesi et al.
(Continued)

FOREIGN PATENT DOCUMENTS

JP    2010533929 A    10/2010
JP    2011527067 A    10/2011
(Continued)

OTHER PUBLICATIONS

Japanese Office Action dated Jun. 25, 2019, filed in counterpart Japanese Patent Application No. 2016-191391, 10 pages (with English translation).

*Primary Examiner* — Albert Decady
*Assistant Examiner* — Enam Ahmed
(74) *Attorney, Agent, or Firm* — Kim & Stewart LLP

(57) ABSTRACT

A memory system includes a nonvolatile memory including a word line and a plurality of memory cells connected to the word line, and a controller configured to transmit to the nonvolatile memory, a command that causes the nonvolatile memory to search for an optimum read voltage for the plurality of memory cells connected to the word line.

14 Claims, 13 Drawing Sheets

(51) Int. Cl.
  *H03M 13/11* (2006.01)
  *H03M 13/15* (2006.01)
  *G11C 16/04* (2006.01)
  *G11C 29/12* (2006.01)

(56) References Cited

U.S. PATENT DOCUMENTS

| | | | |
|---|---|---|---|
| 7,852,675 B2 | 12/2010 | Maejima | |
| 7,859,932 B2 | 12/2010 | Mokhlesi | |
| 8,060,798 B2 | 11/2011 | Roohparvar et al. | |
| 8,372,720 B2 | 2/2013 | Fukuzumi et al. | |
| 8,848,453 B2 | 9/2014 | Shen et al. | |
| 8,952,426 B2 | 2/2015 | Maejima | |
| 9,711,231 B1* | 7/2017 | Yip | G11C 16/28 |
| 2004/0266107 A1* | 12/2004 | Chindalore | H01L 29/40117 438/258 |
| 2010/0149868 A1* | 6/2010 | Yoo | G11C 11/5628 365/185.03 |
| 2011/0038205 A1 | 2/2011 | Chou et al. | |
| 2011/0284946 A1 | 11/2011 | Kiyotoshi | |
| 2012/0008401 A1* | 1/2012 | Katz | G11C 16/26 365/185.18 |
| 2012/0176844 A1* | 7/2012 | Cunningham | G11C 11/14 365/185.22 |
| 2013/0148436 A1 | 6/2013 | Kurosawa | |
| 2014/0108891 A1* | 4/2014 | Strasser | G06F 12/0246 714/773 |
| 2014/0223263 A1* | 8/2014 | Sakurada | G06F 11/1044 714/773 |
| 2015/0006983 A1* | 1/2015 | Lin | G11C 29/50004 714/721 |
| 2016/0077913 A1* | 3/2016 | Yao | G06F 11/1048 714/764 |
| 2016/0170871 A1* | 6/2016 | Hyun | G06F 3/0679 711/103 |
| 2016/0260493 A1 | 9/2016 | Kim | |
| 2016/0276040 A1* | 9/2016 | Han | G11C 16/28 |
| 2017/0371559 A1* | 12/2017 | Higgins | G06F 3/0611 |
| 2018/0068792 A1* | 3/2018 | Egashira | H01B 1/02 |

FOREIGN PATENT DOCUMENTS

| | | | | |
|---|---|---|---|---|
| JP | 2012513072 A | | 6/2012 | |
| JP | 2012-133832 A | | 7/2012 | |
| JP | 2013122804 A | | 6/2013 | |
| JP | 2014-194689 A | | 1/2014 | |
| KR | 20170097267 A | * | 8/2017 | ............ G06F 3/0679 |

* cited by examiner

FIRST PARAMETER INFORMATION 2202

| PAGE NUMBER | OPERATION PARAMETER |
|---|---|
| 0102412 | A1[V] |
| 0103203 | A2[V] |
| ... | ... |

SECOND PARAMETER INFORMATION 2203

| PAGE NUMBER | WRITE GENERATION NUMBER | TEMPERATURE INFORMATION | NUMBER OF TIMES OF READING | NUMBER OF TIMES OF ERASING | ... |
|---|---|---|---|---|---|
| 0102412 | 156 | B1[°C] | 56 | 26 | ... |
| 0103203 | 196 | B2[°C] | 123 | 83 | ... |
| ... | ... | ... | ... | ... | ... |

MEMORY SYSTEM INCLUDING A MEMORY DEVICE THAT CAN DETERMINE OPTIMUM READ VOLTAGE APPLIED TO A WORD LINE

CROSS-REFERENCE TO RELATED APPLICATION

This application is based upon and claims the benefit of priority from Japanese Patent Application No. 2016-191391, filed Sep. 29, 2016, the entire contents of which are incorporated herein by reference.

FIELD

Embodiments described herein relate generally to a memory system.

BACKGROUND

A memory system of one type includes a nonvolatile memory such as a NAND-type flash memory and a memory controller.

DETAILED DESCRIPTION

An embodiment provides a memory system with improved performance.

According to an embodiment, a memory system includes a nonvolatile memory including a word line and a plurality of memory cells connected to the word line, and a controller configured to transmit to the nonvolatile memory, a command that causes the nonvolatile memory to search for an optimum read voltage for the plurality of memory cells connected to the word line.

Hereinafter, embodiments of the present disclosure will be described with reference to the drawings.

First Embodiment

Figure 1:
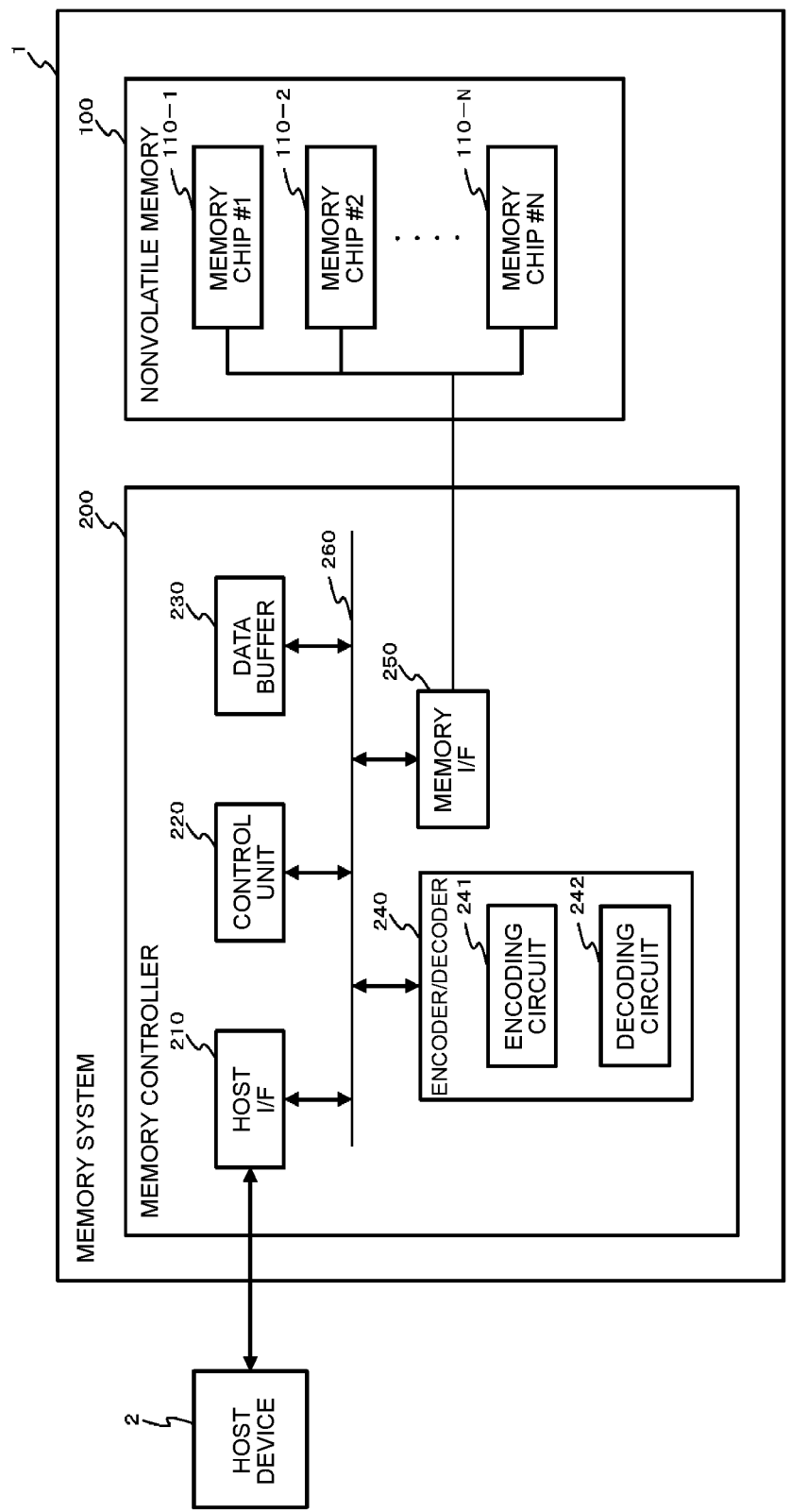
FIG. 1 is a block diagram of a memory system according to a first embodiment.

FIG. 1 is a block diagram of a memory system according to a first embodiment. A memory system 1 is connected to a host device 2 via a communication line to function as an external storage device of the host device 2. The host device 2 may be, for example, an information processing apparatus such as a personal computer, a mobile phone, an imaging apparatus, a portable terminal such as a tablet computer or a smart phone, a game machine, or a vehicle-mounted terminal such as a car navigation system.

A nonvolatile memory 100 is a memory that stores data in a nonvolatile manner. The nonvolatile memory 100 is, for example, a nonvolatile semiconductor memory including a plurality of memory chips (memory modules, memory devices), i.e., a memory chip #1 110-1, . . . , a memory chip # N 110-N. Here, N is an arbitrary natural number.

In the following description, when it is necessary to specify one of the plurality of memory chips 110-1, . . . , 110-N, reference numbers 110-1, . . . , 110-N may be used. Meanwhile, a reference number 110 is used when any of memory chips is referred to or when one memory chip is not distinguished from another memory chip.

For example, the respective memory chips 110 may be operated independently from each other, and may be, for example, NAND-type flash memory chips. In the NAND-type flash memory, in general, writing and reading are performed in a data unit called a page, and erasure is performed in a data unit called a block.

As an example of the nonvolatile memory 100, the NAND-type flash memory will be described below, but a storage unit other than the NAND-type flash memory, such as a three-dimensional structure flash memory, a resistance random access memory (ReRAM), or a ferroelectric random access memory (FeRAM), may be used as the nonvolatile memory 100. Here, it is assumed that the storage unit is a semiconductor memory, but a device other than the semiconductor memory may be used as the storage unit.

The memory system 1 may be a memory card configured as one package including a memory controller 200 and the nonvolatile memory 100, or a solid state drive (SSD).

The memory controller 200 controls writing to the nonvolatile memory 100 according to a write request from the host device 2. In the present embodiment, the request is, for example, an instruction or a command. Also, the memory controller 200 controls reading from the nonvolatile memory 100 according to a read request from the host device 2. The memory controller is also referred to as a controller.

The memory controller 200 includes a host interface (host I/F) 210, a control unit (control circuit) 220, a data buffer 230, an encoder/decoder 240, and a memory interface (memory I/F) 250. The host I/F 210, the control unit 220, the data buffer 230, the encoder/decoder 240, and the memory I/F 250 are connected via an internal bus 260.

The host I/F 210 performs a processing in accordance with a standard of an interface with the host device 2, and outputs requests, user data or the like received from the host device 2, to the internal bus 260. The host I/F 210 transmits user data read from the nonvolatile memory 100, a response from the control unit 220 or the like to the host device 2. In the present embodiment, data written on the nonvolatile memory 100 in accordance with a write request from the host device 2 are referred to as user data.

The control unit 220 collectively controls respective components of the memory system 1. The control unit 220 may be implemented with hardware, or may be implemented by executing a firmware by a processor such as a central processing unit (CPU). In the latter case, when the memory system 1 is powered ON, for example, the processor loads firmware (a control software program) stored in a ROM (not illustrated), to a RAM (not illustrated) within the data buffer 230 or the control unit 220 and executes a predetermined processing so that the processing of the control unit 220 is implemented. Here, the processor is also referred to as a core or a processor core.

When receiving a request from the host device 2 via the host I/F 210, the control unit 220 performs a control according to the instruction. For example, the control unit 220 instructs the memory I/F 250 to write user data and parity on the nonvolatile memory 100 according to the request form the host device 2. The control unit 220 instructs the memory I/F 250 to make an instruction to the nonvolatile memory 100 according to the request form the host device 2.

When a write request is received from the host device 2, the control unit 220 saves user data specified by the write request in the data buffer 230, and determines a storage area (memory area) on the nonvolatile memory 100 for the user data. That is, the control unit 220 determines and manages a writing destination of the user data. A correspondence between a logical address of the user data received from the host device 2 and a physical address of the storage area on the nonvolatile memory 100 where the user data are to be stored is stored in an address translation table.

When a read request is received from the host device 2, the control unit 220 converts a logical address specified by the read request into a physical address using the above described address translation table, and instructs the memory I/F 250 to perform a reading operation at the physical address.

The data buffer 230 temporarily stores the user data received by the memory controller 200 from the host device 2 until the user data are written in the nonvolatile memory 100. Also, the data buffer 230 temporarily stores the user data read from the nonvolatile memory 100 until the user data are transmitted to the host device 2. The data buffer 230 includes, for example, a general purpose memory such as a static random access memory (SRAM) or a dynamic random access memory (DRAM). The data buffer 230 may be mounted within the memory controller 200, or mounted outside the memory controller 200 independently from the memory controller 200.

The control unit 220 saves management information 2201 including the address translation table, in the data buffer 230. The control unit 220 saves the management information 2201 of the data buffer 230, in the nonvolatile memory 100 at a predetermined timing. The control unit 220 saves the management information 2201 of the nonvolatile memory 100, in the data buffer 230 when the memory system 1 starts, and updates the management information 2201 of the data buffer 230 when the management information 2201 is changed.

The encoder/decoder 240 includes an encoding circuit 241 and a decoding circuit 242. The encoder/decoder 240 is also called an error correcting code (ECC) circuit. The encoding circuit 241 encodes data held in the data buffer 230 to generate a code word having the data and a redundant section (parity). The encoding circuit 241 encodes the user data of a first data length (error correction coding) to generate the code word of a second data length. In the encoding performed by the encoding circuit 241, for example, a Bose-Chaudhuri-Hocquenghem (BCH) code, a Reed-Solomon (RS) code, a low density parity check (LDPC) code or the like may be used. Here, any other error correction code may be employed by the encoding circuit 241. The decoding circuit 242 acquires the code word that is data read from the nonvolatile memory 100 via the memory I/F 250, and decodes the acquired code word. When an error correction is failed during decoding, the decoding circuit 242 notifies the control unit 220 of an error correction failure.

The memory I/F 250 controls the nonvolatile memory 100. The memory I/F 250 writes the code word output from the encoding circuit 241, in the nonvolatile memory 100 under the control of the control unit 220 or the like. The memory I/F 250 reads the data from the nonvolatile memory 100 under the control of the control unit 220 or the like, and transmits the read data to the decoding circuit 242 via the data buffer 230. Further, the memory I/F 250 erases the data held in the nonvolatile memory 100 under the control of the control unit 220 or the like.

The memory I/F 250 is connected to the respective memory chips 110 via a bus. The bus is a NAND bus when each memory chip 110 is a NAND-type flash memory. The following descriptions and drawings are described for a configuration of the NAND bus. The NAND bus transmits signals CEn, CLE, ALE, WEn, REn, WPn, RY/BYn, DQ, DQS and DQSn. In the present disclosure, "n" at the end of a signal name indicates an inverted logic of "n" signal at the end, and indicates that the signal has been asserted when the signal has a low level.

An asserted signal CEn makes the memory chip 110 in an enable state. An asserted signal CLE notifies the memory chip 110 that a signal DQ flowing in the memory chip 110 in parallel with the asserted signal CLE is a command. An asserted signal ALE notifies the memory chip 110 that a signal DQ flowing in the memory chip 110 in parallel with the asserted signal ALE is an address. An asserted signal WEn instructs the memory chip 110 to take a signal DQ flowing in the memory chip 110 in parallel with the asserted signal WEn. An asserted signal REn instructs the memory chip 110 to output a signal DQ. An asserted signal WPn instructs the memory chip 110 to prohibit writing and erasure of data. A signal RY/BYn indicates whether the memory chip 110 is in a ready state or a busy state, and indicates a busy state by a low level. The memory chip 110, in the ready state, receives an instruction from the memory controller 200, and the memory chip 110 in the busy state does not receive an instruction from the memory controller 200.

The signal DQ (DQ0 to DQ7) has a width of, for example, 8 bits, is an entity of data, and includes command (CMD), write data or read data (DAT) to/from the memory chip 110, address signal (ADD), status data (STA) and the like. The data read from the memory chip 110 may be simply referred to as read data. Signals DQS and DQSn directed from the memory controller 200 to the memory chip 110 notify the memory chip 110 of an output timing of the signal DQ. Meanwhile, signals DQS and DQSn directed from the memory chip 110 to the memory controller 200 notify the memory controller 200 of an output timing of the signal DQ.

The memory system 1 may include a temperature sensor 300 (See FIG. 4) as a sensor configured to measure a temperature of the memory controller 200, which is arranged around the memory controller 200. In this case, the memory controller 200 may include a temperature sensor I/F (not shown) that has an interface function of communication between the memory controller 200 and the temperature sensor 300, and the control unit 220 may control temperature information measured by the temperature sensor 300 to be acquired through the temperature sensor I/F 270.

Figure 2:
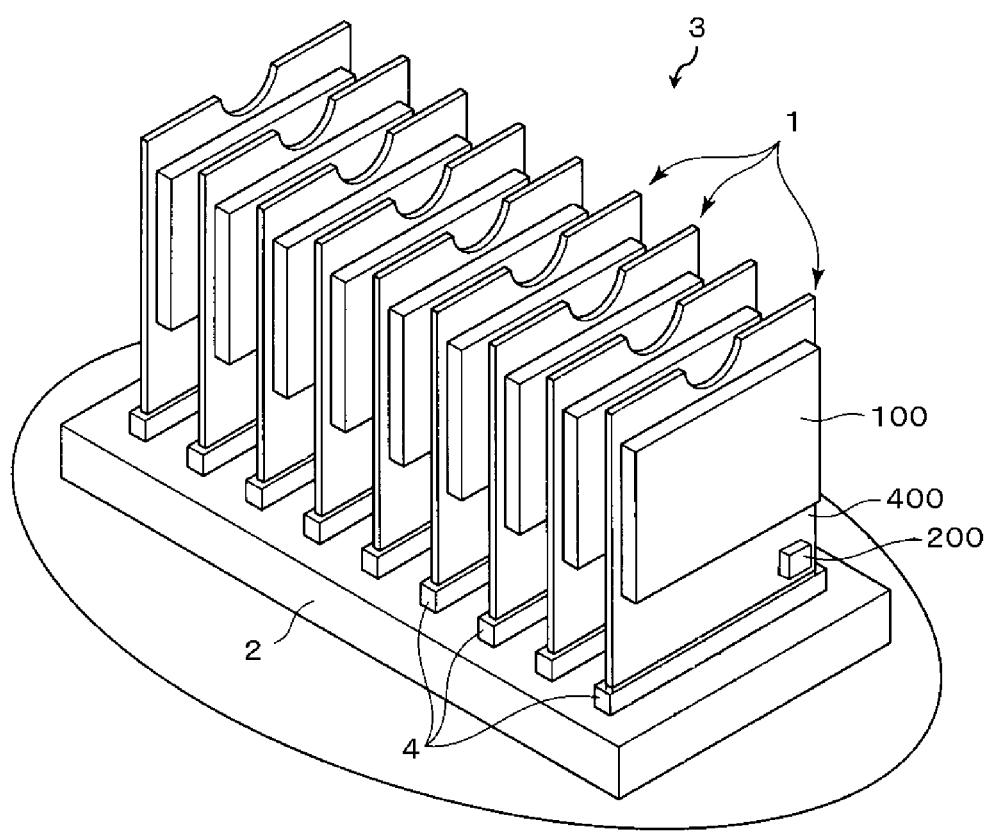
FIG. 2 illustrates a system including the memory system according to the first embodiment.
Figure 3:
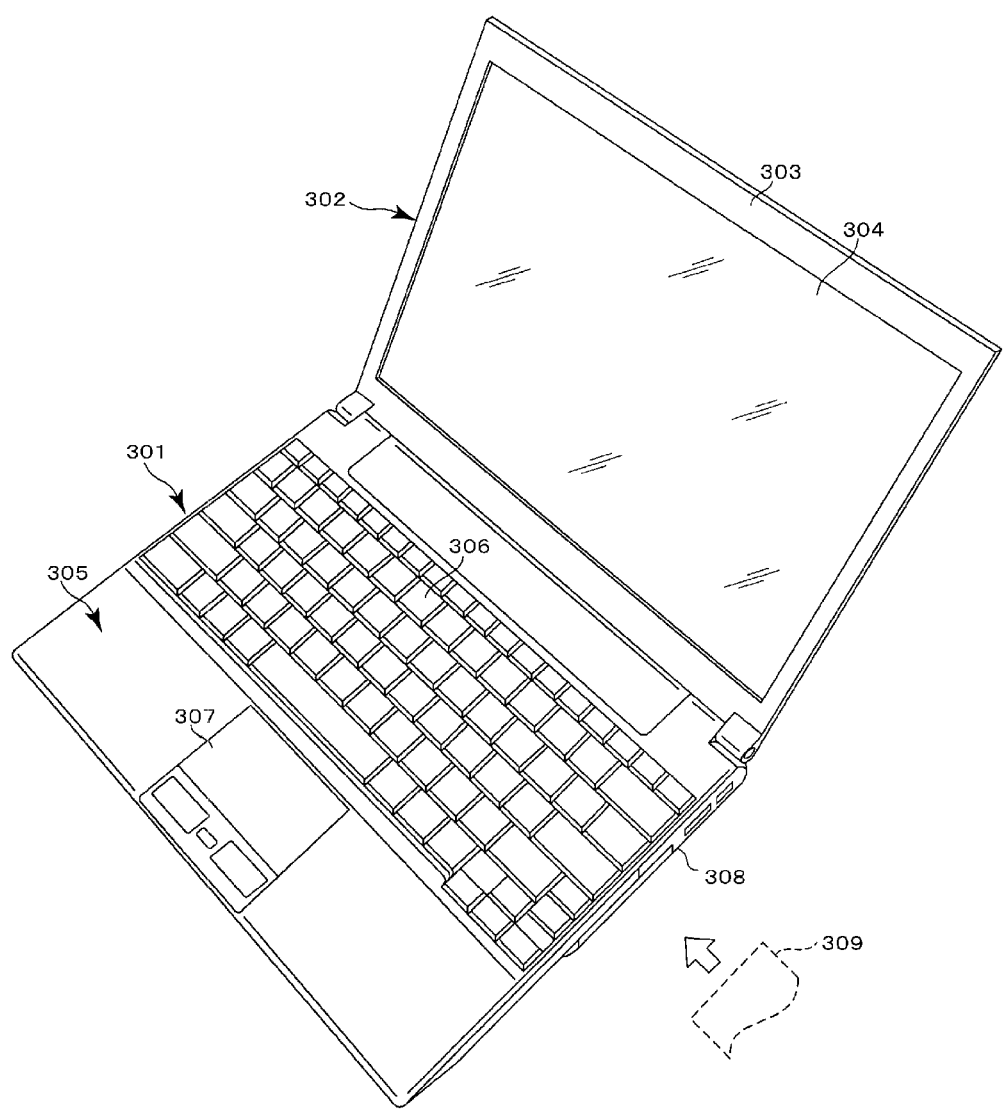
FIG. 3 illustrates a portable computer including the memory system according to the first embodiment.

FIGS. 2 and 3 illustrate examples of a system 3 including the memory system 1 and the host device 2. The system 3 is an example of an electronic device.

As illustrated in FIG. 2, the memory system 1 is included as a storage device within the system 3 such as, for example, a server. The system 3 includes the memory systems 1 and the host device 2 connected to the memory systems 1. The host device 2 includes, for example, a plurality of connectors 4 which are open upwards. The connectors 4 are, for example, slots. In FIG. 2, the memory system 1 includes a board 400, and the nonvolatile memory 100 and the memory controller 200 are mounted on the board 400. The plurality of memory systems 1 is connected to in the connectors 4 of the host device 2, respectively, and supported side by side while standing substantially in a vertical direction. According to such a configuration, the plurality of memory systems 1 may be compactly and collectively mounted, thereby reducing a size of the host device 2.

The memory system 1 may be used as a storage device for electronic devices such as, for example, notebook-type portable computers, tablet terminals, or other detachable notebook PCs (personal computers). As illustrated in FIG. 3, the memory system 1 is mounted in, for example, a portable computer corresponding to the host device 2. Here, the entire portable computer including the memory system 1 serves as the system 3.

The portable computer includes a main body 301 and a display unit 302. The display unit 302 includes a display housing 303, and a display device 304 accommodated in the display housing 303.

The main body 301 includes a casing 305, a keyboard 306, and a touch pad 307 which is a pointing device. The casing 305 includes a main circuit board, an optical disk device (ODD) unit, a card slot 308 and the like.

The card slot 308 is provided at a side surface of the casing 305. A user may insert an additional device 309 into the card slot 308 from the outside of the casing 305.

The memory system 1 may be used while being mounted within the portable computer as a replacement for a hard disk drive (HDD), or may be used as the additional device 309.

Figure 4:
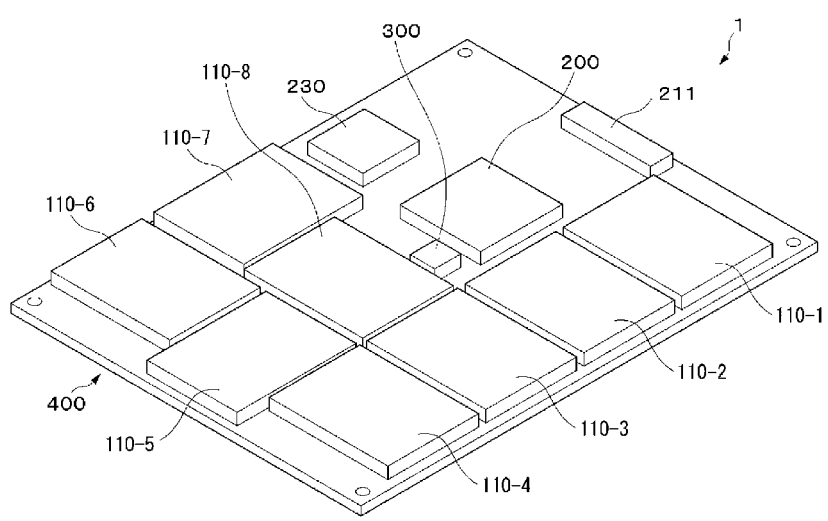
FIG. 4 illustrates an appearance of the memory system according to the first embodiment.

FIG. 4 is a perspective view of a memory system according to the first embodiment. In the present example, the memory system 1 includes the board 400. On the board 400, the memory chips 110-1, 110-2, 110-3, 110-4, 110-5, 110-6, 110-7, and 110-8, a connecting portion 211 included in the host I/F 210, the memory controller 200, a DRAM as the data buffer 230, and the temperature sensor 300 may be mounted, but any other components may be mounted.

The host I/F 210 includes the connecting portion 211 (terminal portion). In the memory system 1 illustrated in FIG. 4, the connecting portion 211 is mounted outside the memory controller 200 independently from the memory controller 200. The connecting portion 211 includes, for example, a plurality of connecting terminals (metal terminals). The connecting portion 211 is inserted into, for example, the connector 4 of the host device 2 to be electrically connected to the connector 4. The host I/F 210 exchanges signals with the host device 2 through the connecting portion 211.

In the memory system 1 illustrated in FIG. 4, one memory chip 110 is arranged such that a side surface thereof faces a side surface of another memory chip 110, the memory controller 200, the DRAM as the data buffer 230 or the temperature sensor 300 with a predetermined-length gap therebetween. The temperature sensor 300 is arranged at a position surrounded by the memory controller 200, the NAND memory chips 110-1, . . . , 110-8, and the DRAM as the data buffer 230. Meanwhile, the arrangement of the NAND memory chips 110-1, 110-2, 110-3, 110-4, 110-5, 110-6, 110-7, and 110-8, the host I/F 210, the memory controller 200, the DRAM as the data buffer 230, and the temperature sensor 300 is exemplary only, but any other arrangement may be adopted.

Figure 5:
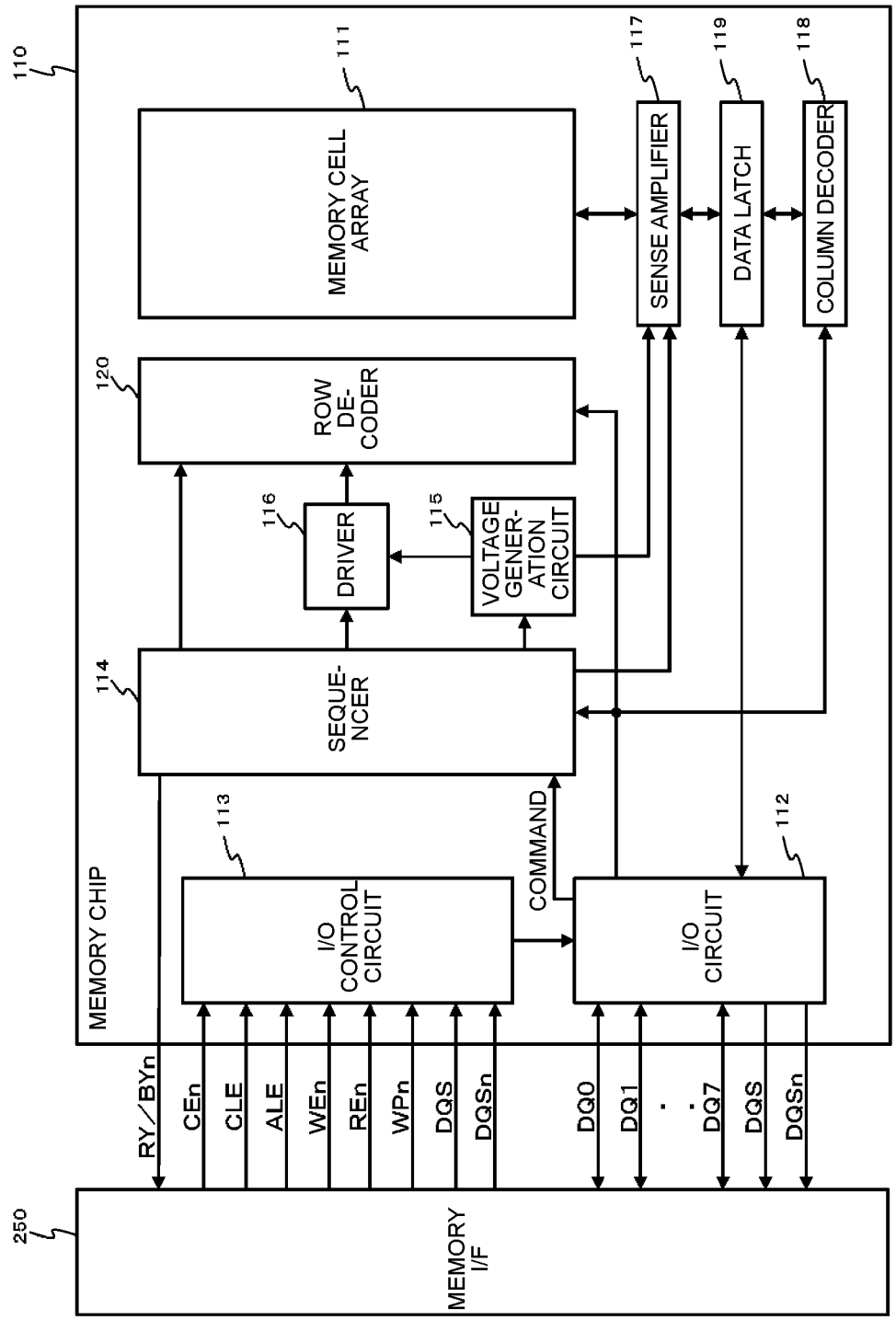
FIG. 5 is a block diagram of a memory chip in the memory system according to the first embodiment.

Subsequently, the configuration of the memory chip 110 will be described. FIG. 5 is a block diagram of the memory chip 110 according to the present embodiment. As described above, the memory chip 110 is, for example, a NAND-type flash memory chip. In the present embodiment, the memory chip 110 is a three-dimensionally stacked NAND-type flash memory in which memory cells are three-dimensionally stacked on the top of a semiconductor substrate.

As illustrated in FIG. 5, the memory chip 110 includes components such as a memory cell array 111, and a peripheral circuit such as an input/output (I/O) circuit 112, an I/O control circuit 113, a sequencer (control circuit) 114, a voltage generation circuit 115, a driver 116, a sense amplifier 117, a column decoder 118, a data latch 119, and a row decoder 120.

The memory cell array 111 includes a plurality of blocks (BLK0, BLK1, . . . ). A block is, for example, a data erasure unit, and data in each block are erased collectively. Data may be erased in a unit smaller than one block (e.g., half of one block).

Each block is a set of a plurality of string units SU (SU0, SU1, . . . ). Each string unit SU is a set of a plurality of NAND strings 131. Each NAND string 131 includes a plurality of memory cell transistors MT. Further, in the memory cell array 111, wiring lines such as a word line WL, a bit line BL, a cell source line CELSRC, and select gate lines SGDL and SGSL are arranged.

The I/O circuit 112 receives or transmits a signal DQ. The I/O circuit 112 also transmits data strobe signals DQS and DQSn.

The I/O control circuit 113 receives various control signals from the memory controller 200, and controls the I/O circuit 112 based on control signals. The control signals include signals CEn, CLE, ALE, WEn, REn, and WPn, and data strobe signals DQS and DQSn.

The sequencer 114 receives a command and an address signal from the I/O circuit 112, and controls the voltage generation circuit 115, the driver 116, the sense amplifier 117, and the column decoder 118 based on the command and the address signal. The sequencer 114 includes a counter 114a and a resistor 114b.

The voltage generation circuit 115 receives predetermined numerical data from the outside of the memory chip 110, and generates various potentials (voltages) from the received numerical data. The predetermined numerical data are, for example, a digital value (DAC value). The generated potentials are supplied to components such as the driver 116 and the sense amplifier 117. The potentials generated by the voltage generation circuit 115 include potentials to be applied to, for example, the word line WL, the select gate lines SGDL and SGSL, and the cell source line CELSRC. By applying various potentials, voltages are applied to various components. The driver 116 receives the potentials generated by the voltage generation circuit 115, and supplies any one selected from the received potentials to the row decoder 120 according to the control of the sequencer 114.

The row decoder 120 receives various potentials from the driver 116, receives an address signal from the I/O circuit 112, selects one block based on the received address signal, and transmits the potential supplied from the driver 116 to the selected block.

The sense amplifier 117 senses the state of the memory cell transistor MT, generates read data based on the sensed state, and transmits write data to the memory cell transistor MT.

The data latch 119 holds write data from the I/O circuit 112, and supplies the write data to the sense amplifier 117. The data latch 119 receives read data from the sense amplifier 117, and supplies the read data to the I/O circuit 112 according to the control of the column decoder 118. The column decoder 118 controls the data latch 119 based on an address signal.

Figure 6:
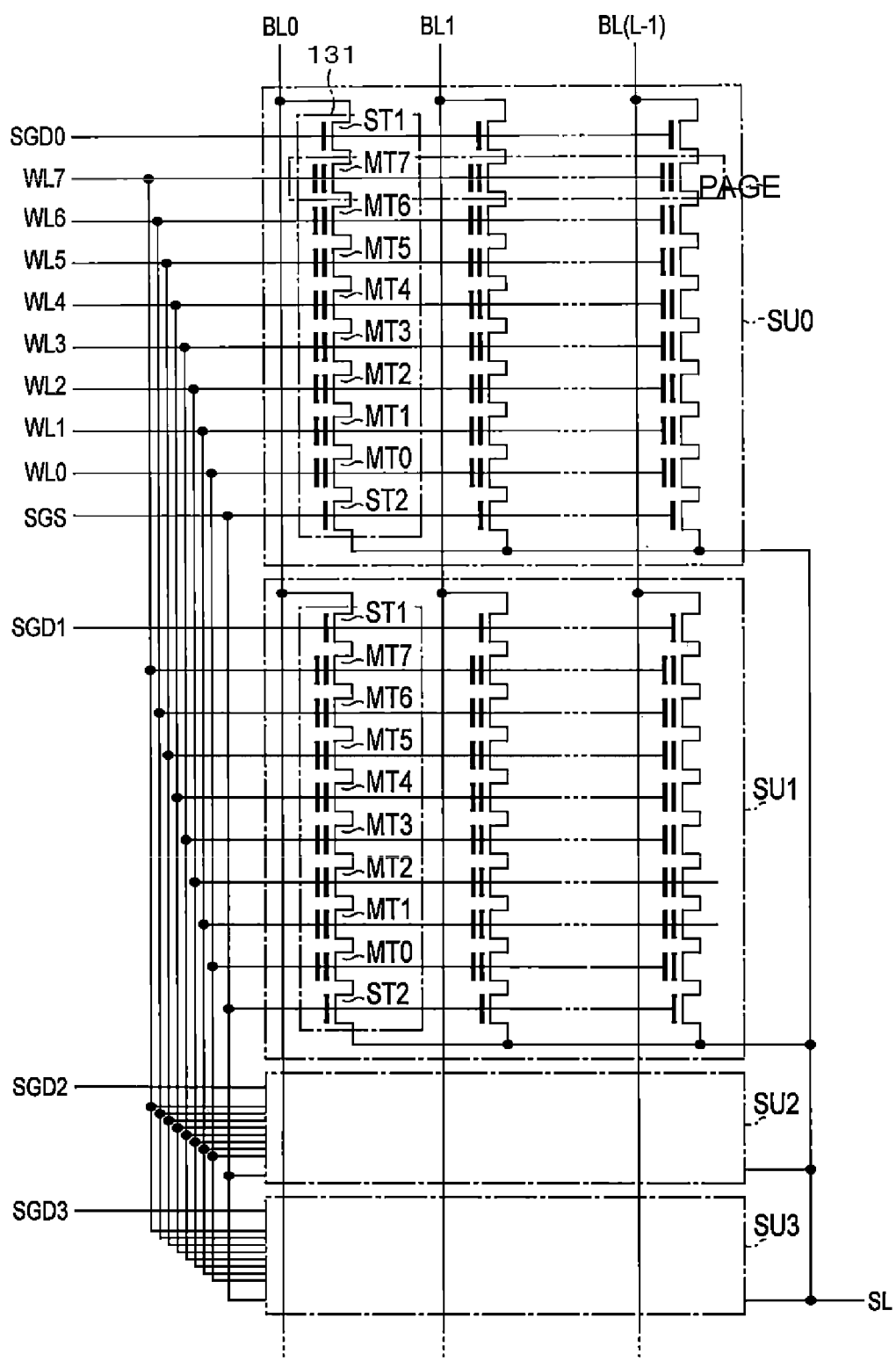
FIG. 6 is a circuit diagram of a memory cell array in the memory system according to the first embodiment.

Subsequently, the configuration of a block included in the memory cell array 111 will be described with reference to FIG. 6. FIG. 6 is a circuit diagram of a block.

As illustrated, the block includes, for example, four string units SU (SU0 to SU3). Each string unit SU includes a plurality of NAND strings 131.

Each of the NAND strings 131 includes, for example, eight memory cell transistors MT (MT0 to MT7), and select transistors ST1 and ST2. Each of the memory cell transistors MT includes a control gate and a stacked gate including a charge storage layer, and holds data in a nonvolatile manner. Here, the number of memory cell transistors MT is not limited to eight (8) but maybe 16, 32, 64, 128, etc. as well. There is no limit to this number. The memory cell transistors MT are arranged between the select transistors ST1 and ST2 such that current paths thereof are connected in series. A current path of the memory cell transistor MT7 at one end side of the serial connection is connected to one end of a current path of the select transistor ST1, and a current path of the memory cell transistor MT0 at the other end side is connected to one end of a current path of the select transistor ST2.

The gates of the select transistors ST1 in the string units SU0 to SU3 are commonly connected to select gate lines SGD0 to SGD3, respectively. Meanwhile, the gates of the select transistors ST2 are commonly connected to the same select gate line SGS among the plurality of string units. The control gates of the memory cell transistors MT0 to MT7 within the same block 0 are commonly connected to word lines WL0 to WL7, respectively.

That is, the word lines WL0 to WL7 and the select gate line SGS are commonly connected among the plurality of string units SU0 to SU3 within the same block. Meanwhile, the select gate lines SGD are separately set for the string units SU0 to SU3 even within the same block.

In the NAND strings 131 in the same row, among the NAND strings 131 arranged in a matrix configuration within the memory cell array 111, the other ends of current paths of the select transistors ST1 are commonly connected to any one of bit lines BL (BL0 to BL (L−1), (L−1) is a natural number equal to or larger than 1). That is, the bit line BL is commonly connected to the NAND strings 131 among a plurality of blocks. The other ends of current paths of the select transistors ST2 are commonly connected to a source line SL. The source line SL is commonly connected to the NAND strings 131, for example, among the plurality of blocks.

As described above, data of the memory cell transistors MT within the same block is erased collectively at once. In contrast, reading and writing of data are performed at once for the plurality of memory cell transistors MT commonly connected to any one of word lines WL in any one of the string units SU of anyone of blocks. When the memory cell transistor MT stores binary (1 bit), a unit performed at once corresponds to one page.

Figure 7:
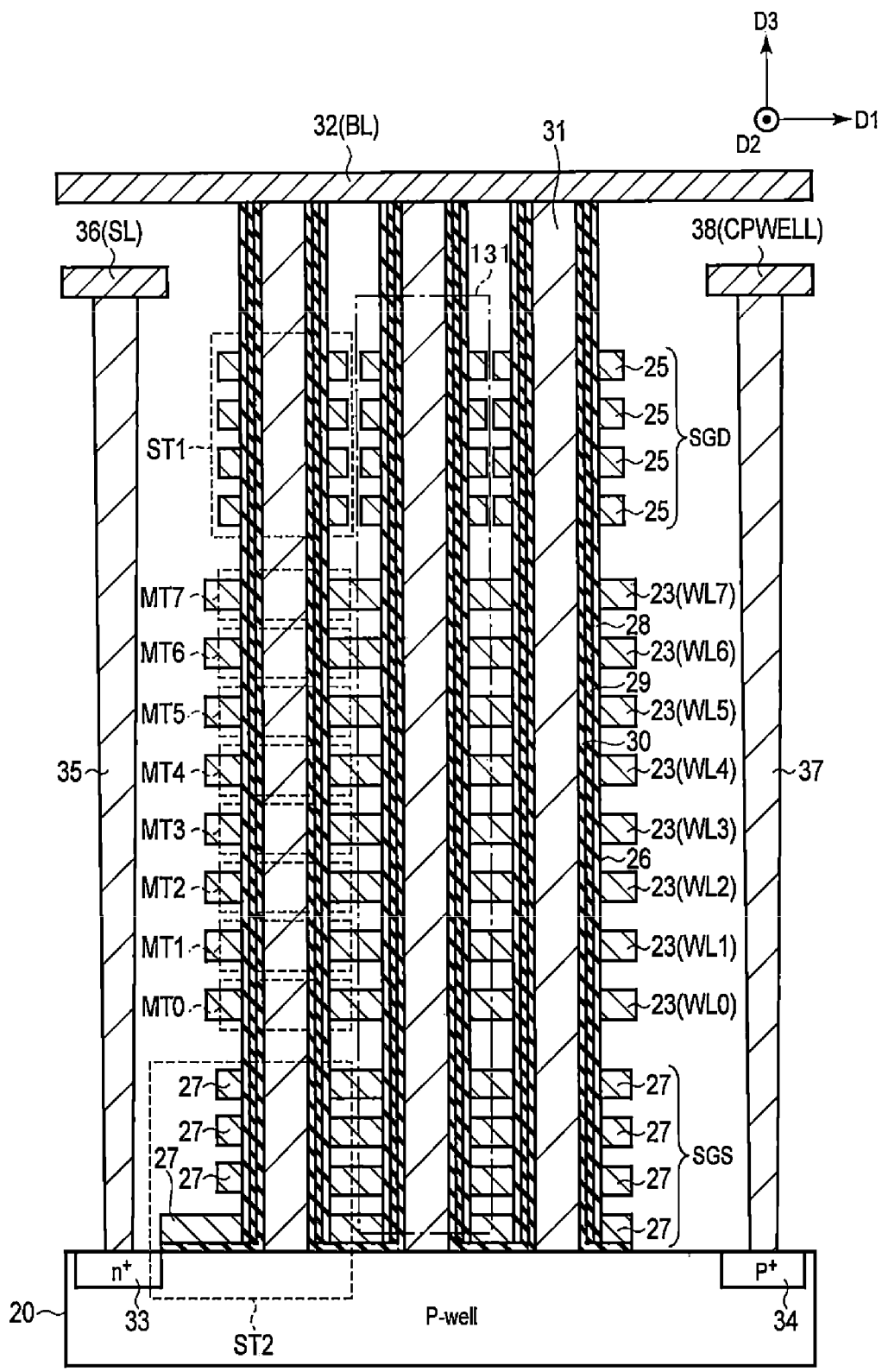
FIG. 7 is a cross-sectional view of the memory cell array in the memory system according to the first embodiment.

FIG. 7 is a cross-sectional view of a partial area of the memory cell array 111 according to the present embodiment. As illustrated, a plurality of NAND strings 131 is formed on a p-well region 20. That is, on the well region 20, a plurality of wiring layers 27 functioning as the select gate line SGS, a plurality of wiring layers 23 functioning as word lines WL, and a plurality of wiring layers 25 functioning as the select gate line SGD are formed.

A memory hole 26 is formed through the wiring layers 25, 23 and 27 to reach the well region 20. A block insulating film 28, a charge storage layer 29 (insulating film), and a gate insulating film 30 are sequentially formed at the side of the memory hole 26, and a conductive film 31 is embedded within the memory hole 26. The conductive film 31 functions as a current path of the NAND string 131, and corresponds to an area in which a channel is formed when the memory cell transistors MT and the select transistors ST1 and ST2 operate.

The wiring layers 27 are formed of, for example, four layers, and function as a gate electrode of the select gate line SGS and the select transistor ST2. The lowermost wiring layer 27 and the gate insulating film 30 are provided so as to reach the vicinity of an $n^+$ impurity diffusion area 33 formed within the surface of the p-well region 20.

The wiring layers 23 are formed of, for example, eight layers above the wiring layers 27. Each of the wiring layers 23 functions as a control gate electrode of word line WL and memory cell transistor MT corresponding thereto.

The wiring layers 25 are formed of, for example, four layers above the wiring layers 23. Each of the wiring layers 25 functions as a gate electrode of the select gate line SGD and the select transistor ST1.

Through the above described configuration, in each NAND string 131, the select transistor ST2, the plurality of memory cell transistors MT, and the select transistor ST1 are sequentially stacked on the well region 20.

In FIG. 7, the select transistors ST1 and ST2 include the charge storage layer 29 like the memory cell transistors MT. However, each of the select transistors ST1 and ST2 does not substantially function as a memory cell that holds data, but functions as a switch. Here, a threshold value at which each of the select transistors ST1 and ST2 is turned ON/OFF may be controlled by injecting electric charges into the charge storage layer 29.

A wiring layer 32 functioning as a bit line BL is formed on the top of the conductive film 31. The bit line BL is connected to the sense amplifier 117.

Further, within the surface of the well region 20, an n$^+$ impurity diffusion layer 33 and a p$^+$ impurity diffusion layer 34 are formed. A contact plug 35 is formed on the diffusion layer 33, and a wiring layer 36 functioning as a source line SL is formed on the contact plug 35. The source line SL is connected to a source line driver (not illustrated). A contact plug 37 is formed on the diffusion layer 34, and a wiring layer 38 functioning as a well wiring CPWELL is formed on the contact plug 37. The well wiring CPWELL is connected to a well driver (not illustrated). The wiring layers 36 and 38 are formed in a layer above the select gate line SGD and below the wiring layer 32. Meanwhile, this structure is exemplary only, and any other structure may be adopted.

The above-described layered structure is repeatedly aligned in the depth direction of the page illustrated in FIG. 7, and a string unit SU is formed by a set of the plurality of NAND strings 131 which are aligned in the depth direction. The wiring layers 27 functioning as the plurality of select gate lines SGS included within the same string unit SU are commonly connected to each other. That is, the gate insulating film 30 is also formed on the well region 20 between adjacent NAND strings 131, and the wiring layer 27 and the gate insulating film 30 adjacent to the diffusion layer 33 are formed reaching the vicinity of the diffusion layer 33.

Accordingly, when the select transistor ST2 is in an "ON" state, the corresponding channel electrically interconnects the memory cell transistor MT0 to the diffusion layer 33. By applying a voltage to the well wiring CPWELL, a potential may be applied to the conductive film 31.

The configuration of the memory cell array 111 may take other configurations. That is, the configuration of the memory cell array 111 is described in, for example, U.S. patent application Ser. No. 12/407,403 entitled "THREE DIMENSIONAL STACKED NONVOLATILE SEMICONDUCTOR MEMORY" filed on Mar. 19, 2009, and further described in U.S. patent application Ser. No. 12/406,524 entitled "THREE DIMENSIONAL STACKED NON-VOLATILE SEMICONDUCTOR MEMORY" filed on Mar. 18, 2009, U.S. patent application Ser. No. 12/679,991 entitled "NON-VOLATILE SEMICONDUCTOR STORAGE DEVICE AND METHOD OF MANUFACTURING THE SAME" filed on Mar. 25, 2010, and U.S. patent application Ser. No. 12/532,030 entitled "SEMICONDUCTOR MEMORY AND METHOD FOR MANUFACTURING SAME" filed on Mar. 23, 2009. These patent applications are incorporated by reference in their entirety herein.

Figure 8:
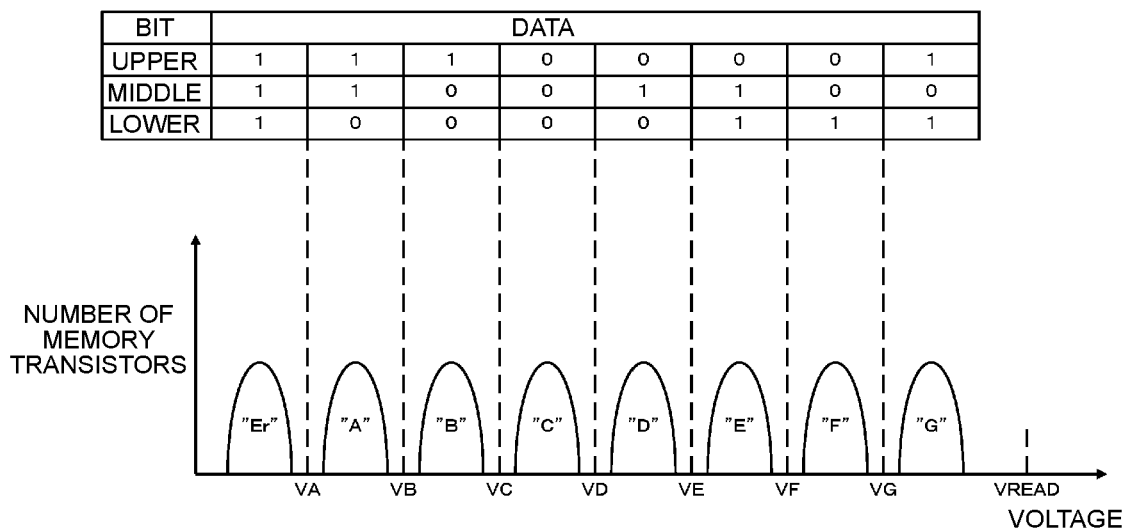
FIG. 8 illustrates a relationship between data held in a nonvolatile memory and a threshold voltage of a cell transistor in the memory system according to the first embodiment.

Subsequently, the memory cell transistor MT will be described with reference to FIG. 8. The memory chip 110 may hold data of one bit or more in one memory cell transistor MT. FIG. 8 illustrates a distribution of a threshold voltage of the memory cell transistor MT by which 3-bit data is held per memory cell transistor, as one example, as a result of data writing. The threshold voltage of each memory cell transistor MT has a value corresponding to the held 3-bit data. When 3 bits are stored per memory cell transistor MT, each memory cell transistor MT may have any of eight threshold voltages. The eight threshold voltages are individually holding, for example, "111" data, "110" data, "100" data, "000" data, "010" data, "011" data, "001" data and "101" data. In addition to the examples in FIG. 8, any other combination of the eight threshold voltages and 3-bit data may be adopted.

A set of data of bits at the predetermined same position in a memory cell transistor MT of one cell unit CU configures a page. A set of data of most significant bits in the memory cell transistor MT of one cell unit CU configures an upper page. A set of data of middle order bits in the memory cell transistor MT of one memory cell unit CU configures a middle page. A set of data of least significant bits in the memory cell transistor MT of one cell unit CU configures a lower page.

Even a plurality of memory cell transistors MT holding the predetermined same 3-bit data may have different threshold voltages due to a characteristic fluctuation, etc. of the memory cell transistors MT. Thus, threshold voltages of the plurality of memory cell transistors MT holding the predetermined same data form one distribution. The distributions are referred to as "Er", "A", "B", "C", "D", "E", "F", and "G" levels. The threshold voltage in the "A" level is higher than the threshold voltage in the "Er" level. Likewise, threshold voltages in the "B", "C", "D", "E", "F" and "G" levels are higher than threshold voltages in the "A", "B", "C", "D", "E" and "F" levels, respectively. The "Er" level indicates a distribution of threshold voltages of the memory cell transistor MT that is in an erased state.

In order to determine data held by a memory cell transistor MT as a read target, the level to which the threshold voltage of the memory cell transistor MT belongs is determined. In order to determine the level, read voltages VA, VB, VC, VD, VE, VF and VG are used. Hereinafter, voltages of certain values, including voltages VA, VB, VC, VD, VE, VF and VG, which are applied to the memory cell transistor MT as a read target to determine a level, may be referred to as a read voltage VCGR.

Whether the threshold voltage of the memory cell transistor MT as a read target exceeds any one of read voltages VCGR is used to determine a level to which the threshold voltage of the memory cell transistor MT belongs. The read voltage VA is higher than the highest threshold voltage possessed by the "Er" level memory cell transistor MT, and lower than the lowest threshold voltage possessed by the "B" level memory cell transistor MT, that is, the read voltage VA is in a range of between the "Er" level and the "A" level. Likewise, read voltages VB, VC, VD, VE, VF, and VG are in a range of between the "A" level and the "B" level, between the "B" level and the "C" level, between the "C" level and the "D" level, between the "D" level and the "E" level, between the "E" level and the "F" level, and between the "F" level and the "G" level, respectively. A memory cell transistor MT having a threshold voltage equal to or higher than a read voltage VCGR maintains a turn-OFF state even when the read voltage VCGR is received at a control gate electrode. Meanwhile, a memory cell transistor MT having a threshold voltage less than a read voltage VCGR remains in "ON" state when the read voltage VCGR is received at a control gate electrode. A voltage VREAD is applied to a word line WL of a memory cell transistor MT of a cell unit CU as a non-read target, and is higher than threshold voltages of memory cell transistors MT at other levels.

The read voltages VA, VB, VC, VD, VE, VF and VG are set in advance, and more specifically, numerical data (DAC values) corresponding to the read voltages VA, VB, VC, VD, VE, VF and VG are set in advance. The numerical data set in advance are, for example, 25 DAC, 90 DAC, 140 DAC, 220 DAC, 300 DAC, 370 DAC, and 420 DAC. These numerical data are stored in, for example, a data area of the memory cell array 111. The numerical data is read from the memory cell array 111 and transmitted to, for example, the resistor 114b when the memory chip 110 is powered ON. The memory controller 200 may acquire these numerical data via the memory I/F 250 and hold the acquired data.

Figure 9:
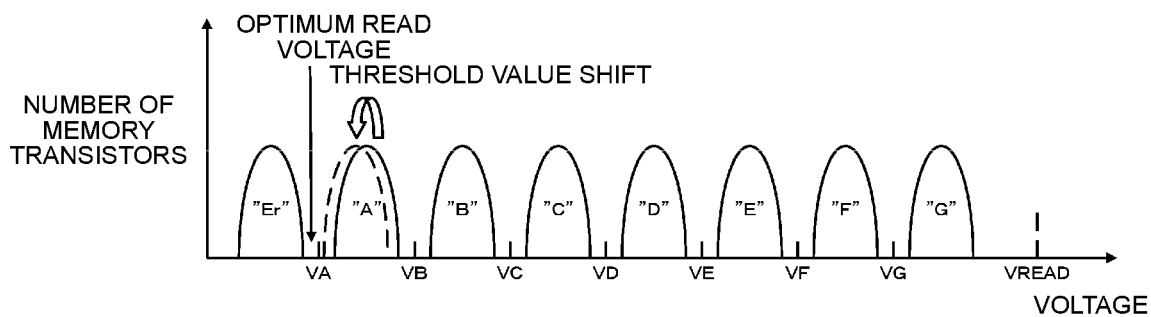
FIG. 9 illustrates shift of a threshold voltage in a memory cell included in the nonvolatile memory of the memory system according to the first embodiment.

A shift of a threshold voltage of a memory cell transistor MT will be described with reference to FIG. 9. The memory cell transistor MT may be influenced by, for example, software program disturbance after writing and read disturbance after reading. By this influence, the threshold voltage of the memory cell transistor MT may shift to the negative side as illustrated in, for example, FIG. 9.

Here, at a preset read voltage, data may not be accurately read from the memory cell transistor MT, thereby increasing a bit error rate. Here, the bit error rate indicates a ratio of error bits included in the read data.

To deal with this issue, the memory controller 200 may execute shift-read or Vth-tracking on a page with an increased bit error rate in order to specify an optimum read voltage.

The shift-read is a read operation that searches for an optimum read voltage of the memory cell transistor MT, and is performed using voltage values shifted from a preset read voltage.

In the shift-read, the memory controller 200 changes a read voltage by a constant amount, and each changed read voltage (trial read voltage) is used to read data from the nonvolatile memory 100. The control unit 220 executes a read operation on the nonvolatile memory 100 at each of read voltages (trial read voltages) within a search area centered on a preset read voltage corresponding to each threshold voltage distribution. Then, the decoding circuit 242 of the encoder/decoder 240 decodes the read values. The control unit 220 determines a read voltage with the smallest number of error bits to be an optimum read voltage.

The Vth-tracking is also a read operation carried out by the memory controller 220 with respect to the nonvolatile memory 100, to search for an optimum read voltage of the memory cell transistors MT. Here, the Vth-tracking executed by the memory controller 200 may be referred to as first Vth-tracking.

In the first Vth-tracking, the control unit 220 determines a Vth distribution based on values of data that are read using respective read voltages (trial read voltages) obtained by dividing, for example, a read voltage range by a predetermined number.

For example, the control unit 220, first, reads data by applying one read voltage to a predetermined word line, and counts the number of "1"s included in the read data.

For example, the control unit 220 subsequently reads data by applying a read voltage shifted by a predetermined voltage width to the predetermined word line, counts the number of "1"s included in the read data, and determines a difference between the number of "1"s at this time and the number of "1"s counted when the read voltage is used before the shift of the voltage width.

Figure 10:
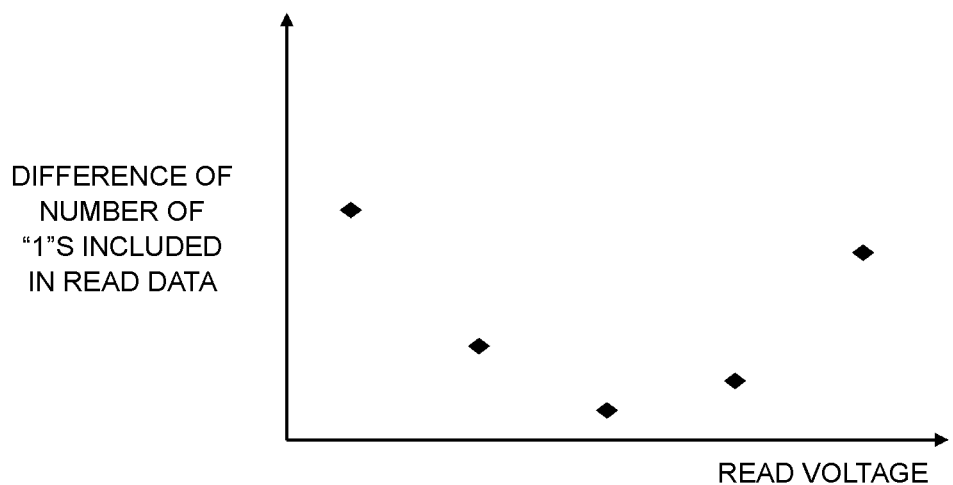
FIG. 10 illustrates difference data of a memory cell that stores data of which value is the number of "1".

For example, the control unit 220 subsequently repeats the above described operation a predetermined number of times, and then may obtain the Vth distribution as illustrated in FIG. 10 in which a read voltage is plotted in the horizontal axis and a difference is plotted in the vertical axis. The control unit 220 may perform a predetermined smoothing processing after the plotting, thereby obtaining the Vth distribution as illustrated in FIG. 10.

For example, the control unit 220 obtains a read voltage at the valley of the Vth distribution as illustrated in FIG. 10, at which the difference of the numbers of "1" counted at adjacent read voltages in the Vth distribution becomes a minimum, and determines the obtained read voltage as an optimum read voltage of the memory cell transistor MT. Here, the memory cell transistor MT is also simply referred as a memory cell.

Subsequently, management information 2201 will be described with reference to FIGS. 11 and 12. The management information 2201 further includes first parameter information 2202 and second parameter information 2203, but may include other information.

Figures 11, 12, 13:
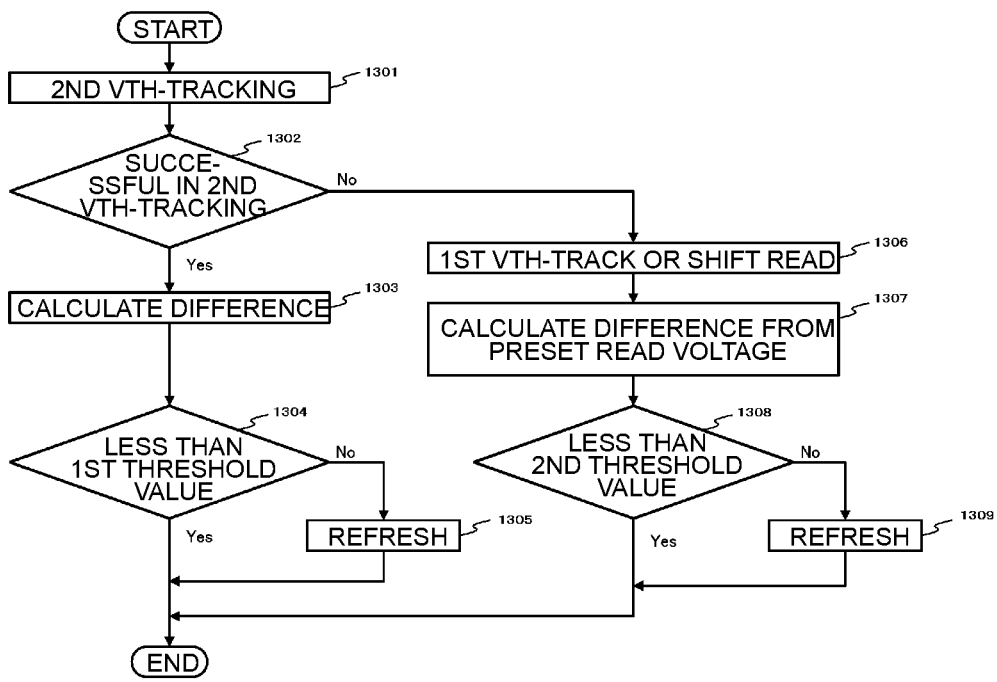
FIG. 11 illustrates an example of a content of first parameter information in the memory system according to the first embodiment.
FIG. 12 illustrates an example of a content of second parameter information in the memory system according to the first embodiment.
FIG. 13 is a flow chart illustrating a patrol processing in the memory system according to the first embodiment.

FIG. 11 illustrated an example of a content of the first parameter information 2202. As illustrated, the first parameter information 2202 is a table in which various operation parameters are associated with a page number as an example of page identification information. The operation parameter is, for example, a read voltage used when data are read from the corresponding page, but may be any other value. When the operation parameter is a read voltage, a preset read voltage value is set as an initial value. Meanwhile, the control unit 220 may update the operation parameter by an optimum read voltage determined through, for example, shift-read or Vth-tracking. The control unit 220 may save the preset read voltage value, apart from the read voltage, in the first parameter information 2202.

FIG. 12 illustrates an example of a content of the second parameter information 2203. As illustrated, the second parameter information 2203 includes a part of all of, for example, a write generation number, temperature information such as a temperature of the memory controller 200 acquired by the temperature sensor 300 during writing, the number of times of reading after writing, the number of times of erasing, the number of times of writing and the like, on a page number as an example of page identification information.

Both the first parameter information 2202 and the second parameter information 2203 may be tables classified for each block in each memory chip 110.

The write generation number is information related to the order in which data is written. After starting to write data on a block, the memory system 1 is configured to write data on pages of the block until writing is completely performed on all pages of the block. The memory system 1 may assign, for example, write generation numbers "1" to "m" (m is a natural number of 2 or more) to pages of a block in the order of writing, or may commonly assign a write generation number "m" to respective pages of a block.

When writing data on, for example, another block, the memory system 1 may assign write generation numbers "m+1" to "2m" to pages of another block in the order of writing, or may commonly assign a write generation number "2m" to respective pages of the block.

As described above, the value of the write generation number tends to decrease as the elapsed time is prolonged after the writing is performed. Since the frequency of writing is not uniform, a difference between write generation numbers is not directly proportional to a difference between elapsed times. However, it can be said that at least a page with a small write generation number is longer in an elapsed time from the writing as compared to a page with a large write generation number. Here, instead of the write generation number, an elapsed time after writing is performed may be held.

Subsequently, descriptions will be made an access processing to data stored in the nonvolatile memory 100 of the memory system according to the first embodiment.

In the memory system according to the first embodiment, when the memory system 1 receives a read request, a write request, a data erasure request, a data deletion request such as a trim command or the like from the host device 2, or when the memory controller 200 executes garbage collection, refreshing, wear leveling, patrol processing or the like in the background, the memory controller 200 accesses the nonvolatile memory 100.

The garbage collection is also called compaction. Since, in the nonvolatile memory 100, an erasure unit of data is different from a unit of writing and reading of data, as re-writing on the nonvolatile memory 100 progresses, a block is fragmented by invalid data. As the number of fragmented blocks increases, the number available blocks decreases. The garbage collection is a process performed to increase the number of available blocks, in which, for example, valid data from a plurality of active blocks including valid data and invalid data is collected, and re-written on a separate block to increase a free block.

The active block indicates a block on which valid data are written. The free block indicates a block on which no valid data are written. After erasure, the free block may be reused as a post-erasure block. The free block in the present embodiment includes both a pre-erasure block on which no valid data has been written, and a post-erasure block. The valid data are data associated with a logical address, and the invalid data are data not associated with a logical address. The post-erasure block becomes an active block when data are written.

The refreshing is a process of re-writing data within one block into another block. When detecting, for example, deterioration of data within one block, such as an increase of the number of corrected bits in an error correction processing, the memory controller 200 executes a refreshing process of re-writing data within one block into another block.

The wear leveling is a process of leveling the numbers of times of re-writing on blocks of the nonvolatile memory 100 by exchanging, for example, data stored in a block with a large number of times of re-writing or erasure with data stored in a block with a small number of times or re-writing or erasure.

The patrol processing is an operation of checking and determining whether data written on the nonvolatile memory 100 are lost due to deterioration of a medium, and is voluntarily performed by the memory system 100 without receiving an instruction from the host device 2.

The patrol processing includes reading data stored in, for example, the nonvolatile memory 100 by a predetermined unit and determining the read data based on an error correction result in the decoding circuit 242, thereby detecting a block with an increased error. In the present embodiment, the predetermined unit is set as one cell unit CU, but another unit may be set to a unit of patrol reading.

In the checking process, for example, the number of error bits of read data is compared with a threshold value, and data of which number of error bits exceeds the threshold value becomes a refreshing target. For example, when the number of error bits of data read from one cell unit CU exceeds a threshold value, the control unit 220 sets data within a block to which the cell unit CU belongs as a refreshing target. That is, the control unit 220 re-stores the data stored in the block including the cell unit CU of which number of error bits exceeds the threshold value, in another block. The control unit 220 invalidates the data stored in the original block, that is, sets the original block as a free block.

The control unit 220 periodically executes a patrol processing on active blocks in the nonvolatile memory 100. The control unit 220 executes a patrol processing on all active blocks within a cycle time Ta. When completing one patrol processing on all active blocks within a predetermined cycle time Ta, the control unit 220 subsequently performs another patrol processing to complete the patrol processing on all active block within the next cycle time Ta.

The cycle time Ta is counted in terms of time conversion in which the memory system 1 is turned ON, and is set in an arbitrary time unit such as, for example, 10 hours, or 100 hours. When the memory system 1 receives a command such as a read request, a write request or the like from the host device 2 during execution of the patrol processing, the memory controller 200 executes a processing on the command received from the host device 2 in preference to the patrol processing.

FIG. 13 is a flow chart illustrating a patrol processing carried out in the memory system according to the first embodiment. In the flow chart in FIG. 13, descriptions will be made subsequently to a step where the memory controller 200 has determined to perform patrolling of a predetermined cell unit CU of the nonvolatile memory 100.

In the present embodiment, it is assumed that the memory chip 110 including a cell unit CU that becomes a patrol target is a memory chip 110-1.

The control unit 220 requests the memory chip 110-1 to execute Vth-tracking on the cell unit CU that is a patrol target via the memory I/F 250 (step 1301).

The control unit 220 transmits a command that requests the memory chip 110-1 to execute Vth-tracking on the cell unit CU that is a patrol target via the memory I/F 250 in order to request the memory chip 110-1 to search for an optimum value of a read voltage for the cell unit CU that is a patrol target.

The memory chip 110-1 transmits a Vth-tracking result (VD), which typically includes an optimum read voltage determined by the memory chip 110-1, via the memory I/F 250 as a response to the command that has been transmitted from the control unit 220 via the memory I/F 250 and requests execution of the Vth-tracking. The control unit 220 acquires the Vth-tracking result (VD) transmitted from the memory chip 110-1 via the memory I/F 250.

The above-described operation in which the control unit 220 requests the memory chip 110 to execute Vth-tracking on a predetermined cell unit CU, the memory chip 110 executes the Vth-tracking on the predetermined cell unit CU and outputs a Vth-tracking result to the memory controller 200, and the control unit 220 acquires the Vth-tracking result output from the memory chip 110 in response to the execution request of the Vth-tracking, is also referred to as second Vth-tracking. Generally, the first Vth-tracking (i.e., the one carried out by the memory controller 200) is more accurate than the second Vth-tracking (i.e., the one carried out by the memory chip 110), because the memory controller 200 generally has greater processing capacity than the memory chip 110.

Figure 14:
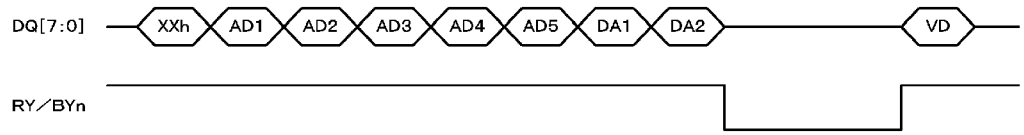
FIG. 14 illustrates an example of a command sequence transmitted from a memory controller to a memory chip in the memory system according to the first embodiment.

FIG. 14 illustrates an example of a command sequence indicating signals transmitted from the memory controller 200 to the memory chip 110 via the memory I/F 250 in order to request the memory chip 110 to execute Vth-tracking on the cell unit CU that is a patrol target. FIG. 14 also illustrates signals RY/BYn flowing from the memory chip 110 to the memory controller 200 in response to the request of the Vth-tracking. In FIG. 14, only signals transmitted as signals DQ, and RY/BYn signals indicating a ready/busy state of the memory chip 110-1 are illustrated while other signals CEn, CLE, ALE, WEn, REn, WPn, DQS and DQSn are omitted.

As illustrated in FIG. 14, the control unit 220 transmits a command XXh via the memory I/F 250. During the transmission of the command XXh, a signal CLE (not illustrated)

is asserted. The command XXh is, for example, a command that instructs a request of the Vth-tracking.

The control unit 220 transmits address signals subsequently to the command XXh, via the memory I/F 250, over five cycles. The address signal specifies an area as a read target in the storage area of the nonvolatile memory 100. During transmission of the address signal, a signal ALE (not illustrated) is asserted. The address signal includes, for example, column address signals CA (AD1 and AD2) in first and second cycles. The column address signal CA includes a column address, and the column address specifies a column as a read target in a specified page. The address signal includes, for example, row address signals RA (AD3 to AD5) in third to fifth cycles. The row address signal RA specifies a row address, that is, a selection page. A word line WL connected to a cell unit CU including a memory cell transistor MT providing a storage space of a selection page is referred to as a selected word line WL.

After transmitting the row address signals RA (AD3 to AD5), the control unit 220 transmits a signal DA1 that specifies a minimum voltage value in Vth-tracking executed by the memory chip 110, via the memory I/F 250. The minimum voltage value when the Vth-tracking is started is specified as, for example, a DAC value.

After transmitting the signal DA1 that specifies the minimum voltage value in the execution of the Vth-tracking, the control unit of the memory controller 200 transmits a signal DA2 that specifies a change read voltage for the Vth-tracking executed by the memory chip 110, via the memory I/F 250. The change read voltage is specified as, for example, a DAC value.

When receiving the signal DA2 that specifies the change read voltage for execution of the Vth-tracking, the memory chip 110 executes the Vth-tracking. During the execution of the Vth-tracking, the memory chip 110 notifies the memory controller 200 of a busy state.

The memory chip 110 executes the Vth-tracking on the cell unit CU specified by the column address signals CA (AD1 and AD2) and the row address signals RA (AD3 to AD5) received from the memory controller 200 via the memory I/F 250, using the signals received from the memory controller 200, i.e., the signal DA1 that specifies the minimum voltage value, and the signal DA2 that specifies the change read voltage.

The memory chip 110, in the first step, reads data by applying a read voltage corresponding to the minimum voltage value to the selected word line WL of the cell unit CU as a Vth-tracking target, and counts the number of "1"s included in the read data.

After the first step, the memory chip 110, in the second step, reads data by applying a read voltage (trial read voltage) obtained by adding a voltage corresponding to the change read voltage to the voltage corresponding to the minimum voltage value, to the selected word line WL, counts the number of "1"s included in the read data, and determines a difference between the counted number and the number of "1"s counted in the first step.

After the second step, the memory chip 110, in the third step, reads data by applying a read voltage (new trial read voltage) obtained by adding a voltage corresponding to the change read voltage to the voltage (trial read voltage) used in the second step, to the selected word line WL, counts the number of "1"s included in the read data, and determines a difference between the counted number and the number of "1"s counted in the second step.

Then, the memory chip 110 may repeat the processing in the third step a predetermined number of times, thereby obtaining a graph as illustrated in FIG. 10 in which a read voltage is plotted in the horizontal axis and a difference is plotted in the vertical axis. Here, a predetermined smoothing processing after the plotting may be performed so that the graph is obtained.

The memory chip 110 calculates a read voltage at which the difference of the number of "1"s becomes a minimum, as an optimum read voltage, and sets the calculated optimum read voltage as a Vth-tracking result (VD). In graphing, when the bottom portion (recess portion) of a graph is not found or a plurality of bottom portions of a graph are found, the memory chip 110 may set information indicating that the optimum read voltage cannot be calculated as the Vth-tracking result (VD).

When the minimum of the difference of the number of "1"s exceeds a predetermined number, the memory chip 110 may set information indicating that the optimum read voltage cannot be calculated as the Vth-tracking result (VD).

The memory controller 200 repeatedly asserts a signal REn (not illustrated) so that the Vth-tracking result (VD) is output from the memory chip 110, and acquires the output Vth-tracking result (VD) via the memory I/F 250.

The command described in FIG. 14 is output to only one memory chip 110. That is, for example, the memory controller 200 may issue a command of a Vth-tracking request to each of the memory chips 110-1, . . . , 110-N via the memory I/F 250. Thus, the memory controller 200 may request each of the memory chips 110-1, . . . , 110-N to execute Vth-tracking on a predetermined cell unit CU.

The control unit 220 determines whether the memory chip 110-1 has succeeded in the Vth-tracking, that is, the second Vth-tracking, based on the Vth-tracking result (VD) acquired from the memory chip 110-1 via the memory I/F 250 (step 1302).

When, for example, the Vth-tracking result acquired from the memory chip 110-1 is not information indicating that the optimum read voltage cannot be calculated, the control unit 220 determines that the memory chip 110-1 has succeeded in the Vth-tracking.

When it is determined that the memory chip 110-1 has succeeded in the Vth-tracking (step 1302: Yes), the control unit 220 acquires the optimum read voltage as the Vth-tracking result from the memory chip 110-1, and determines a difference between the acquired read voltage and a predetermined read voltage (step 1303).

The information of the optimum read voltage that is the Vth-tracking result transmitted by the memory chip 110-1 via the memory I/F 250 may be a voltage value in a unit of V, or predetermined numerical data such as a DAC value.

The control unit 220 determines whether a difference between the acquired read voltage and the predetermined read voltage is less than a predetermined first value (step 1304). When it is determined that the difference is not less than the predetermined first value (step 1304: No), the control unit 220 refreshes a block including the cell unit CU as a patrol target (step 1305).

When it is determined that the memory chip 110-1 has not succeeded in the Vth-tracking (step 1302: No), the control unit 220 acquires the optimum read voltage by performing the above described first Vth-tracking or shift-read on the cell unit CU (step 1306).

The control unit 220 calculates a difference between the optimum read voltage acquired by the first Vth-tracking or the shift-read and the predetermined read voltage (step 1307), and determines whether the difference is less than a predetermined second value (step 1308). When it is determined that the difference is not less than the predetermined second value (step 1308: No), the control unit 220 refreshes a block including the cell unit CU as a patrol target (step 1309). The predetermined second value may be equal to or different from the predetermined first value.

The control unit 220 may update information of a read voltage held by the memory controller 200 or information of an operation parameter of the first parameter information 2202, with the read voltage acquired through the first Vth-tracking or the shift-read in step 1306.

Figure 15:
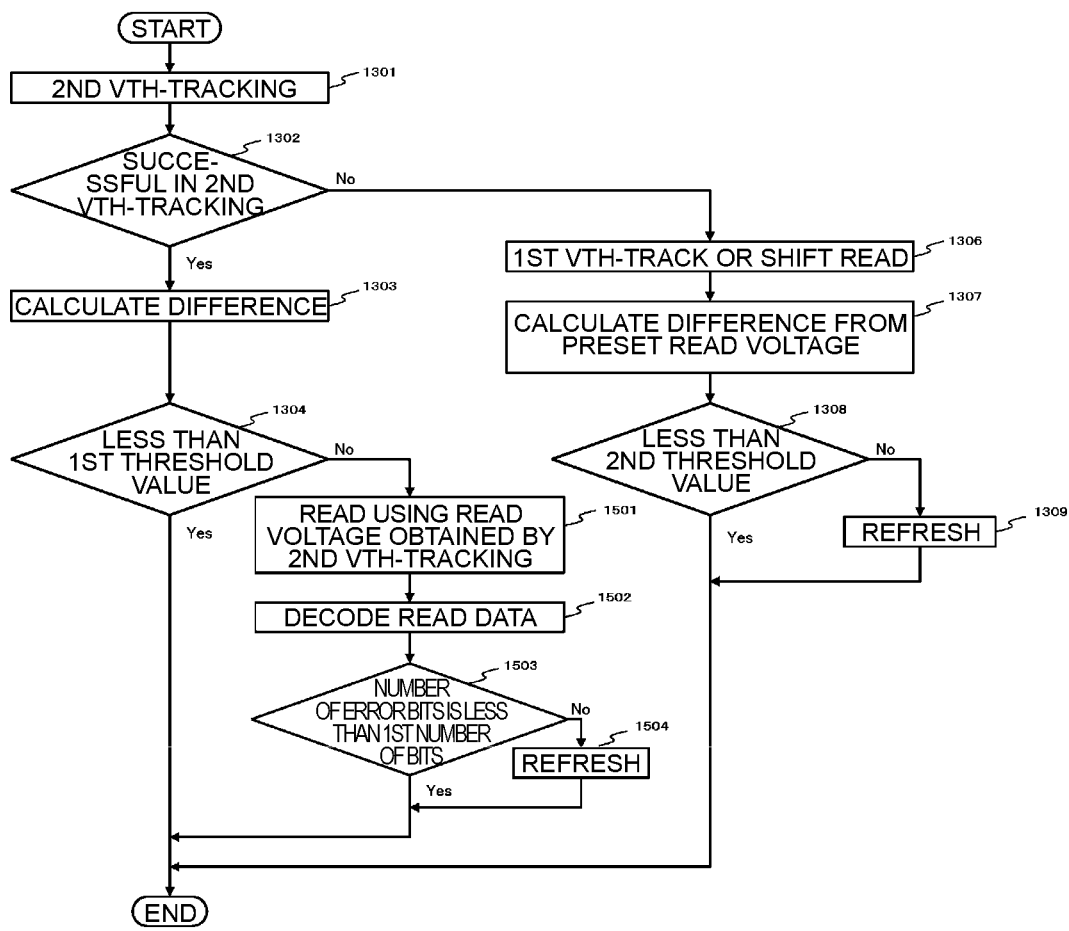
FIG. 15 is a flowchart illustrating a first modification of a patrol processing carried out in the memory system according to the first embodiment.

FIG. 15 is a flowchart illustrating a first modification of a patrol processing of the memory system according to the first embodiment. In FIG. 15, in the same manner as in FIG. 13, descriptions will be made subsequently to a step where the memory controller 200 has determined to perform patrolling of a predetermined cell unit CU of the nonvolatile memory 100. In FIG. 15, the same components as those in the configuration in FIG. 13 are denoted by the same reference numerals.

The control unit 220 determines whether a difference between the read voltage acquired by the second Vth-tracking and the predetermined read voltage is less than a predetermined first value (step 1304). When it is determined that the difference is not less than the predetermined first value (step 1304: No), the control unit 220 reads data of the cell unit CU via the memory I/F 250, using the read voltage acquired by the second Vth-tracking (step 1501).

The memory controller 200 decodes the read data (step 1502). The control unit 220 instructs the decoding circuit 242 to decode the read data of the cell unit CU, and the decoding circuit 242 decodes the data for which instruction has been made from the control unit 220. The decoding circuit 242 outputs a decoding result to the control unit 220. That is, when an error correction is successful during decoding, the decoded data is notified to the control unit 220, while when an error correction is failed during decoding, an error correction failure is notified to the control unit 220.

The control unit 220 determines whether the number of detected error bits in the decoding performed on the read data of the cell unit CU by the decoding circuit 242 is less than a predetermined first number of bits (step 1503). When it is determined that the number of detected error bits is not less than the predetermined first number (step 1503:No), the control unit 220 refreshes a block including the cell unit CU as a patrol target (step 1504).

Figure 16:
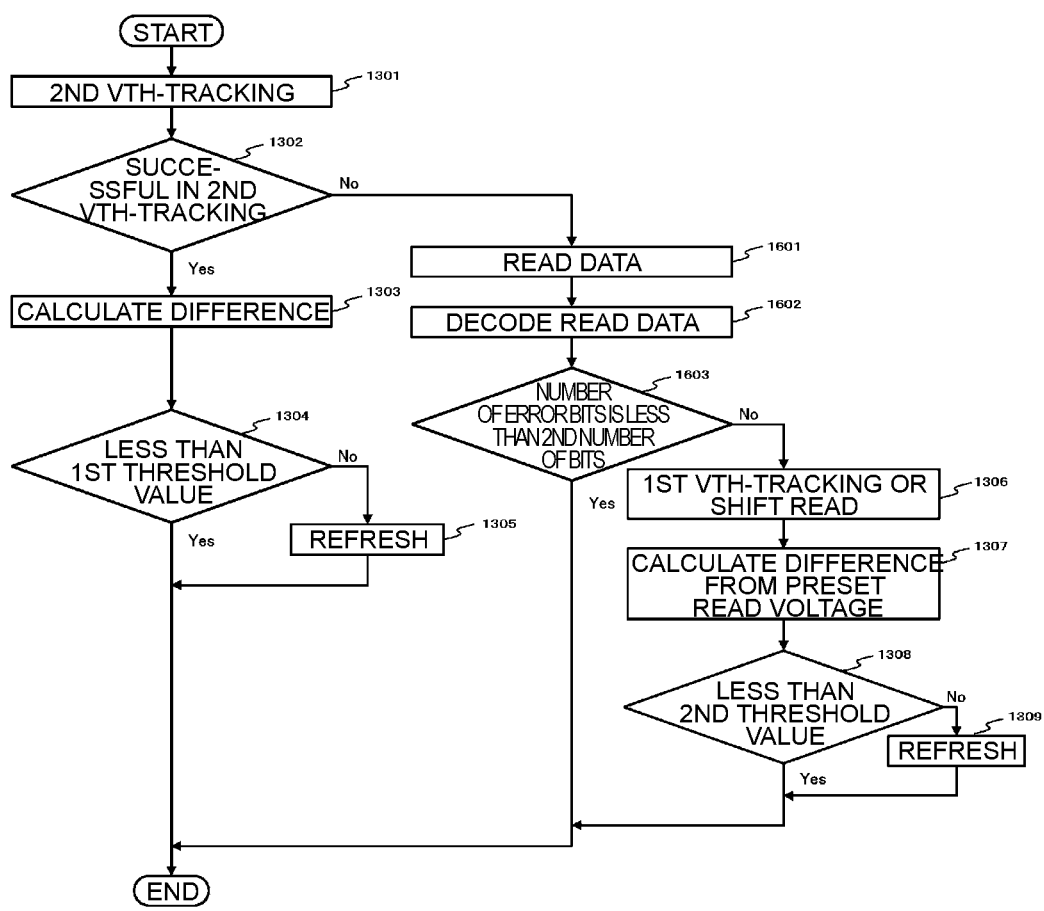
FIG. 16 is a flowchart illustrating a second modification of a patrol processing carried out in the memory system according to the first embodiment.

FIG. 16 is a flowchart illustrating a second modification of a patrol processing of the memory system according to the first embodiment. In FIG. 16, in the same manner as in FIG. 13, descriptions will be made subsequently to a step where the memory controller 200 has determined to perform patrolling of a predetermined cell unit CU of the nonvolatile memory 100. In FIG. 16, the same components as those in the configuration in FIGS. 13 and 15 are denoted by the same reference numerals.

When it is determined that the memory chip 110-1 has not succeeded in the Vth-tracking (step 1302: No), the control unit 220 reads data of the cell unit CU via the memory I/F 250 using a read voltage held by the memory controller 200 (step 1601), and decodes the read data (step 1602). The control unit 220 instructs the decoding circuit 242 to decode the read data of the cell unit CU, and the decoding circuit 242 decodes the data for which instruction has been made from the control unit 220. The decoding circuit 242 outputs a decoding result to the control unit 220. That is, when an error correction is successful during decoding, the decoded data are notified to the control unit 220, while when an error correction is failed during decoding, an error correction failure is notified to the control unit 220.

The control unit 220 determines whether the number of detected error bits in the decoding performed on the read data of the cell unit CU by the decoding circuit 242 is less than a predetermined second number of bits (step 1603). When it is determined that the number of detected error bits is not less than the predetermined second number (step 1603: No), the control unit 220 acquires an optimum read voltage by performing the first Vth-tracking or shift-read on the cell unit CU (step 1306). The control unit 220 calculates a difference between the acquired read voltage and the read voltage held by the memory controller 200 (step 1307), and determines whether the difference is less than a predetermined second value (step 1308). When it is determined that the difference is not less than the predetermined second value (step 1308: No), the control unit 220 refreshes a block including the cell unit CU as a patrol target (step 1309).

According to the first embodiment, the memory controller 200 determines whether to perform refreshing based on the difference between the read voltage acquired by the second Vth-tracking and a predetermined read voltage during the patrol processing.

As a result, in the memory system according to the first embodiment, the memory controller 200 may perform the patrol processing using the result of the second Vth-tracking executed by the memory chip 110 without performing the first Vth-tracking or shift-read. This may reduce a processing load of the memory controller 200.

In the memory system according to the first embodiment, since it is determined whether to perform refreshing without executing an error correction processing, a processing load of the memory controller 200 may be reduced during the patrol processing. Since the processing load of the memory controller 200 is reduced, the performance of the memory system 1 is improved. In the memory system according to the first embodiment, the reduction of the processing load of the memory controller 200 during the patrol processing may reduce a time required for the patrol processing. This may reduce power consumption of the memory controller 200 and allow the patrol processing to be executed in a relatively shorter time and with relatively lower power consumption.

According to the first embodiment, when the optimum read voltage cannot be acquired by the second Vth-tracking, the memory controller 200 determines whether to perform refreshing based on the difference between the read voltage acquired by the memory controller 200 through the first Vth-tracking or shift-read and a predetermined read voltage. In this case as well, since the memory controller 200 determines whether to perform refreshing without executing an error correction processing, a processing load of the memory controller 200 may be reduced during the patrol processing. Thus, the patrol processing may be executed in a shorter time and with lower power consumption.

Second Embodiment

Figure 17:
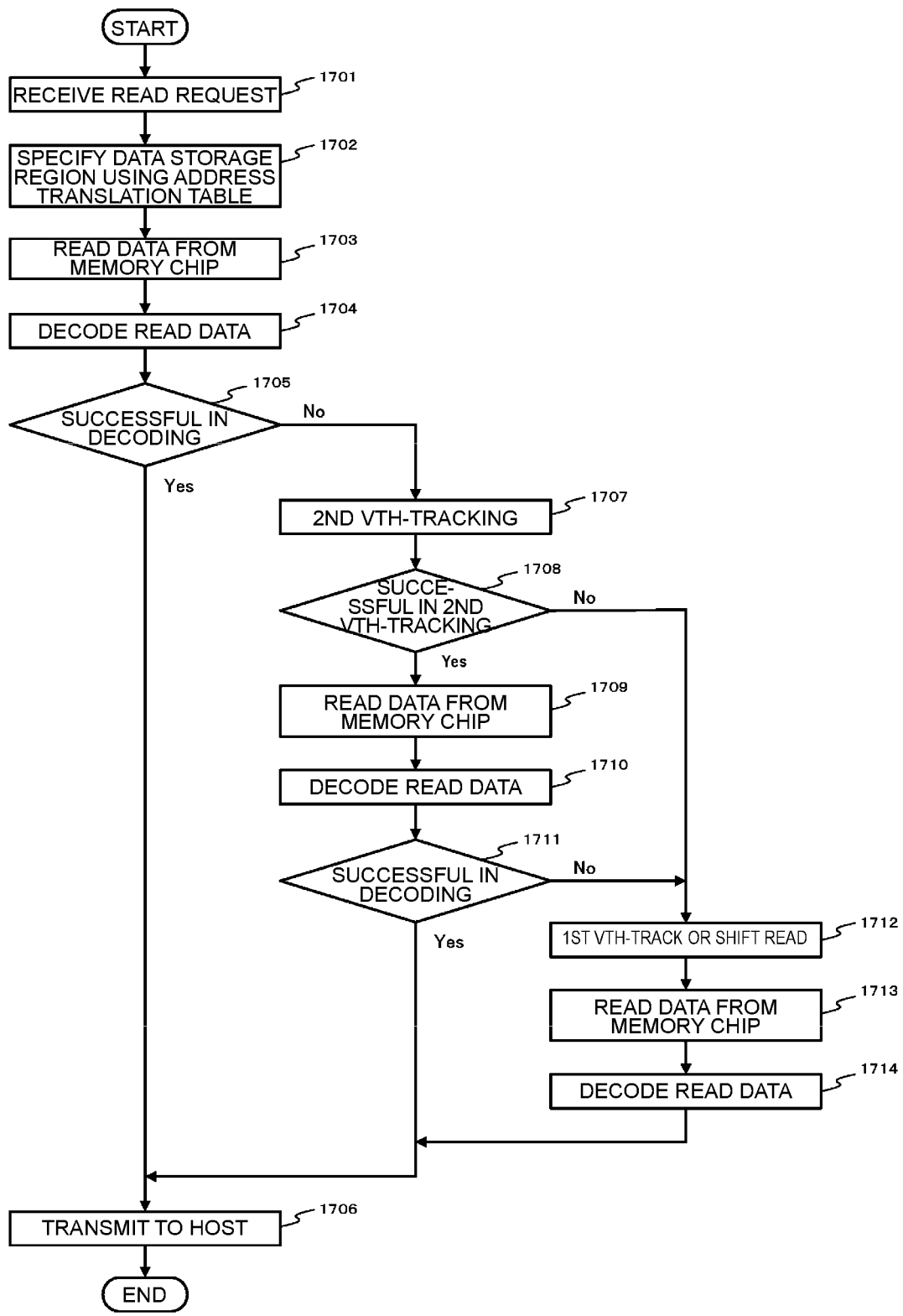
FIG. 17 is a flowchart illustrating a process of reading data in response to a read request from a host device 2, carried out in a memory system according to a second embodiment.

FIG. 17 is a flow chart illustrating a process of reading data from the nonvolatile memory 100 in response to a read request from the host device 2 in a memory system according to a second embodiment. In FIG. 17, the same components as those in the configuration shown in FIG. 13 are denoted by the same reference numerals. In the description of the present embodiment, redundant explanation of the same configuration and operation as that of the first embodiment will be omitted. In the memory system 1 according to the present embodiment, the external appearance, the configuration and the like are the same as those shown in FIGS. 1 to 12.

The flow chart in FIG. 17 illustrates a process of receiving a read request from the host device 2, reading the requested data from the nonvolatile memory 100, and transmitting the read result to the host device 2.

In the read request received from the host device 2, an amount of data the host device 2 requests to read out from the memory system 1, address information indicating a data read-out position, or the like is specified. The memory system 1 may determine whether the read request can be received, and then may receive the read request from the host device 2 when it is determined that the read request can be received. In FIG. 17, it is assumed that the read request can be received without the above described step, and descriptions will be made subsequently to a step where the memory controller 200 of the memory system 1 has received the read request from the host device 2 via the host I/F 210.

When the memory controller 200 receives a read instruction from the host device 2, the process in FIG. 17 starts. When the memory controller 200 receives the read request from the host device 2 via the host I/F 210 (step 1701), the control unit 220 converts a logical address specified by the read request, into a physical address using an address translation table in order to specify a storage place of data as a target of the read request, and determines which physical address of which memory chip 110 is to be address-accessed in order to process the read request from the host device 2 (step 1702).

In the present embodiment, it is assumed that the memory chip 110 serving as an access destination corresponding to the logical address specified by the read request from the host device 2 is a memory chip 110-1.

The control unit 220 instructs the memory I/F 250 to read data from the memory chip 110-1, and reads the data from the memory chip 110-1 via the memory I/F 250 (step 1703).

Here, reading is a normal reading, and the memory controller 200 reads the data from the memory chip 110-1 using an operation parameter of the first parameter information 2202 via the memory I/F 250. In the memory chip 110-1, when a read instruction is received by the I/O circuit 112, the sequencer 114 controls the voltage generation circuit 115, the driver 116, the sense amplifier 117, the column decoder 118 and the row decoder 120 so that the data is read from the page specified by the read instruction, and the read data is output to the memory I/F 250 by the I/O circuit 112. The memory controller 200 receives the read data via the memory I/F 250.

Subsequently, the memory controller 200 decodes the data read from the memory chip 110-1 (step 1704). The control unit 220 instructs the decoding circuit 242 to decode the data read from the memory chip 110-1, and the decoding circuit 242 decodes the data for which instruction has been made from the control unit 220. The decoding circuit 242 outputs a decoding result to the control unit 220. That is, when an error correction is successful during decoding, the decoded data are notified to the control unit 220, while when an error correction is failed during decoding, an error correction failure is notified to the control unit 220.

Then, when it is determined that the error correction is successful (step 1705: Yes), the control unit 220 transmits user data, i.e., the decoded data, to the host device 2 via the host I/F 210 (step 1706).

When it is determined that the error correction is not successful (step 1705: No), the control unit 220 executes second Vth-tracking. That is, when it is determined that the error correction is not successful (step 1705: No), the control unit 220 acquires a Vth-tracking result (VD) on a cell unit CU as a patrol target from the memory chip 110-1 via the memory I/F 250 (step 1707). The processing in step 1707 is the same as a request to the memory chip 110-1 for the Vth-tracking and acquisition of the Vth-tracking result (VD) from the memory chip 110-1 in response to the request in the first embodiment (step 1301).

The control unit 220 determines whether the memory chip 110-1 has succeeded in the Vth-tracking, that is, the second Vth-tracking, based on the Vth-tracking result (VD) acquired from the memory chip 110-1 via the memory I/F 250 (step 1708). The processing in step 1708 is the same as a processing of determining whether the memory chip 110-1 has succeeded in the Vth-tracking, that is, the second Vth-tracking in the first embodiment (step 1302).

When it is determined that the memory chip 110-1 has succeeded in the Vth-tracking (step 1708: Yes), the control unit 220 acquires a read voltage from the Vth-tracking result output from the memory chip 110-1, and reads the data from the memory chip 110-1 using the acquired read voltage (step 1709).

Next, the memory controller 200 decodes the data read from the memory chip 110-1 in step 1709 (step 1710). The control unit 220 instructs the decoding circuit 242 to decode the data read from the memory chip 110-1 in step 1709, and the decoding circuit 242 decodes the data for which instruction has been made from the control unit 220. The decoding circuit 242 outputs a decoding result to the control unit 220. That is, when an error correction is successful during decoding, the decoded data are notified to the control unit 220, while when an error correction is failed during decoding, an error correction failure is notified to the control unit 220.

Then, when it is determined that the error correction is successful (step 1711: Yes), the control unit 220 transmits user data, i.e., the decoded data, to the host device 2 via the host I/F 210 (step 1706).

When it is determined that the error correction is not successful (step 1711: No), the control unit 220 executes first Vth-tracking (step 1712).

The control unit 220 instructs the memory I/F 250 to read data from the memory chip 110-1, and reads the data from the memory chip 110-1 via the memory I/F 250 using the read voltage obtained through the first Vth-tracking (step 1713).

Subsequently, the memory controller 200 decodes the data read from the memory chip 110-1 (step 1714). The control unit 220 instructs the decoding circuit 242 to decode the data read from the memory chip 110-1, and the decoding circuit 242 decodes the data for which instruction has been made from the control unit 220. The decoding circuit 242 outputs a decoding result to the control unit 220. That is, when an error correction is successful during decoding, the decoded data are notified to the control unit 220, while when an error correction is failed during decoding, an error correction failure is notified to the control unit 220.

Next, when the error correction is successful, the control unit 220 transmits the user data as the decoded data to the host device 2 via the host I/F 210, while when the error correction failure is notified from the decoding circuit 242, the control unit 220 transmits the read-out error (step 1706).

In the memory system according to the present embodiment, the control unit 220 executes the first Vth-tracking in steps 1712 and 1713, and reads data from the memory chip 110-1 using the read voltage obtained through the first Vth-tracking. Instead, shift-read may be used to read data from the memory chip 110-1.

According to the second embodiment, the memory controller 200 first performs a normal reading, executes second Vth-tracking when an error correction of data obtained through the normal reading is not successful, and reads data from the memory chip 110 using a read voltage acquired through the second Vth-tracking.

According to the second embodiment, when the error correction of data obtained by the memory controller 200 through the normal reading is not successful, the memory controller 200 may perform data reading using the result of the Vth-tracking executed by the memory chip 110 without performing the first Vth-tracking or shift-read. This may reduce a processing load of the memory controller 200, and as a result, the performance of the memory system 1 is improved. This may reduce the processing load of the memory controller 200 in the read-out process, thereby reducing the power consumption of the memory controller 200. Thus, the read-out process may be executed with lower power consumption. That is, according to the second embodiment, reading with high precision may be achieved with less processings, thereby achieving low power consumption.

Third Embodiment

Figure 18:
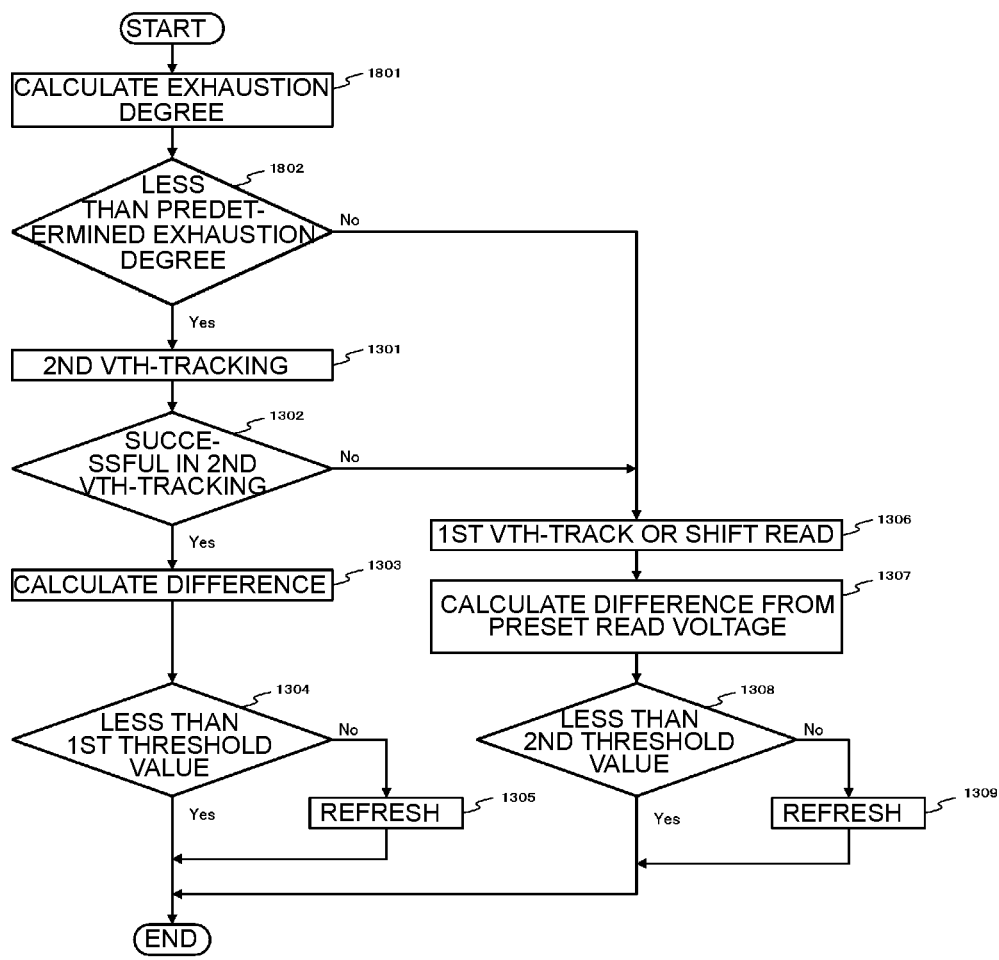
FIG. 18 is a flow chart illustrating a patrol processing carried out in a memory system according to a third embodiment.

FIG. 18 is a flow chart illustrating a patrol processing of a memory system according to the third embodiment. In FIG. 18, the same components as those in the configuration shown in FIG. are denoted by the same reference numerals. In the description of the present embodiment, redundant explanation of the same configuration and operation as that in the first embodiment will be omitted. In the memory system 1 according to the present embodiment, the external appearance, the configuration and the like are the same as those shown in FIGS. 1 to 12.

In FIG. 18, in the same manner as FIG. 13, descriptions will be made subsequently to a step where the memory controller 200 has determined to perform patrolling of a predetermined cell unit CU of the nonvolatile memory 100.

In the present embodiment, it is assumed that the memory chip 110 including a cell unit CU that becomes a patrol target is a memory chip 110-1.

The memory system according to the third embodiment is different from the memory system according to the first embodiment in that the memory controller 200 specifies a read voltage by first Vth-tracking or shift-read without executing second Vth-tracking when an exhaustion degree of the cell unit CU as an access destination is equal to or higher than a predetermined exhaustion degree.

The control unit 220 calculates an exhaustion degree on the cell unit CU as a patrol target from the memory chip 110-1 (step 1801), and determines whether the calculated exhaustion degree is less than a predetermined exhaustion degree (step 1802).

When the control unit 220 calculates the exhaustion degree, the exhaustion degree may be the number of times of reading of the cell unit CU as an access destination, the number of times of writing, the write generation number, the number of times of erasing of, for example, the cell unit CU as the access destination, or the like, or may be calculated by an arithmetic expression including a combination thereof.

The control unit 220 may refer to the second parameter information 2203 so as to acquire the number of times of reading of the cell unit CU as the access destination, the number of times of writing, the write generation number, the number of times of erasing of, for example, the cell unit CU as the access destination, or the like.

When, for example, the number of times of reading of the cell unit CU as the access destination is less than a predetermined number of times of reading, when the number of times of writing of the cell unit CU as the access destination is less than a predetermined number of times of writing, when the write generation number of the cell unit CU as the access destination is less than a predetermined number, or when the number of times of erasing of, for example, the cell unit CU as the access destination is less than a predetermined number of times of erasing, the control unit 220 determines that the calculated exhaustion degree is less than the predetermined exhaustion degree. However, any other determination method may be adopted. The control unit 220 may make a determination by calculating the exhaustion degree by the arithmetic expression, and comparing the calculated exhaustion degree to the predetermined exhaustion degree.

The control unit 220 may determine the exhaustion degree of the cell unit CU as the access destination using data other than the number of times of reading of the cell unit CU as the access destination, the number of times of writing, and the number of times of erasing of, for example, the cell unit CU as the access destination. The control unit 220 may calculate the exhaustion degree of the cell unit CU as the access destination by, for example, the sum of the numbers of times of erasing of all blocks included in the memory chip 110-1 as the access destination, and compare the calculated exhaustion degree to the predetermined exhaustion degree, thereby executing the determination in step 1802.

When it is determined that the calculated exhaustion degree is less than the predetermined exhaustion degree (step 1802: Yes), the control unit 220 acquires a Vth-tracking result (VD) on the cell unit CU as a patrol target from the memory chip 110-1 via the memory I/F 250 (step 1301), and then executes the same processings as those in the memory system according to the first embodiment.

When it is determined that the calculated exhaustion degree is not less than the predetermined exhaustion degree (step 1802: No), the control unit 220 acquires an optimum read voltage by performing first Vth-tracking or shift-read on the cell unit CU as a patrol target (step 1306), calculates a difference between a read voltage acquired by the first Vth-tracking or shift-read and a predetermined read voltage (step 1307), determines whether the difference is less than a predetermined second value (step 1308), and refreshes a block including the cell unit CU as a patrol target (step 1309) when it is determined that the difference is not less than the predetermined second value (step 1308: No).

In the memory controller 200 of the memory system according to the present embodiment, when it is determined that the calculated exhaustion degree is not less than the predetermined exhaustion degree (step 1802: No), or when it is determined that the memory chip 110-1 has not succeeded in the Vth-tracking (step 1302: No), the difference between the read voltage acquired by the first Vth-tracking or shift-read and the predetermined read voltage is compared to the predetermined second value. Meanwhile, the predetermined second value as a comparison target may be individually set for each of these cases.

According to the third embodiment, as in the first embodiment, the memory controller 200 may read data using the result obtained through second Vth-tracking without performing first Vth-tracking or shift-read during the patrol processing, thereby reducing a processing load of the memory controller 200.

As in the first embodiment, since it is determined whether to perform refreshing without executing an error correction processing, a processing load of the memory controller 200 may be reduced during the patrol processing. The reduction of the processing load of the memory controller 200 during the patrol processing improves the performance of the memory system 1.

As in the first embodiment, the reduction of the processing load of the memory controller 200 during the patrol processing may reduce a time required for the patrol processing. This may reduce power consumption of the memory controller 200 and allow the patrol processing to be executed in a shorter time and with lower power consumption.

According to the third embodiment, when the exhaustion of the memory chip 110 has progressed to some extent, the second Vth-tracking is not executed. When the exhaustion of the memory chip 110 progresses to some extent, a possibility of a failure of the second Vth-tracking, that is, a failure of the Vth-tracking by the memory chip 110 increases. Thus, when the exhaustion of the memory chip 110 progresses to some extent, the memory controller 200 may skip the second Vth-tracking, thereby more efficiently executing the patrol processing.

It should be noted that the present disclosure is not limited to the above-described embodiments, and it is obvious that various modifications can be made without departing from the gist of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory including a word line and a plurality of memory cells connected to the word line; and
    a controller configured to:
        perform a first threshold voltage tracking operation, during which the controller determines an optimum read voltage for the plurality of memory cells connected to the word line based on data read from the plurality of memory cells using multiple read voltages;
        calculate an exhaustion degree of the plurality of memory cells connected to the word line based on the number of times of erasing of a block including the plurality of memory cells connected to the word line; and
        when the calculated exhaustion degree is less than a predetermined threshold, perform a second threshold voltage tracking operation to cause the nonvolatile memory to determine an optimum read voltage, wherein, during the second threshold voltage tracking operation, the controller transmits to the nonvolatile memory, a command that causes the nonvolatile memory to search for an optimum read voltage for the plurality of memory cells connected to the word line, wherein
        the nonvolatile memory is configured to, in response to the command, search an optimum read voltage for the plurality of memory cells connected to the word line using multiple read voltages, and to transmit a response including a search result.

2. The memory system according to claim 1, wherein nonvolatile memory includes a plurality of blocks, each of which is a data erasure unit and includes word lines and memory cells connected to the word lines, and
    when receiving the transmitted response from the nonvolatile memory, the controller determines whether to store data stored in a first block including the plurality of memory cells connected to the word line, in a second block, based on the received response.

3. The memory system according to claim 2, wherein the controller is configured to calculate a first difference that is a difference between the optimum read voltage determined through the second threshold voltage tracking operation and a preset read voltage, and stores the data stored in the first block in the second block when the first difference is larger than a first value.

4. The memory system according to claim 2, wherein when the search result indicates that the optimum read voltage was not calculated, the controller performs the first threshold voltage tracking operation by transmitting multiple read requests to the nonvolatile memory, calculates a second difference that is a difference between the optimum read voltage determined through the first threshold voltage tracking operation by the controller and the preset read voltage, and saves the data stored in the first block in the second block when the second difference is larger than a predetermined second value.

5. The memory system according to claim 4, wherein when the search result indicates that the optimum read voltage was not calculated, the controller reads data from the plurality of memory cells connected to the word lines, and then when the read data cannot be decoded, the controller performs the first threshold voltage tracking operation by transmitting multiple read requests to the nonvolatile memory.

6. The memory system according to claim 1, wherein the memory system is connectable to a host device,
    when a read request is received from the host device connected to the memory system, the controller reads first data corresponding to the read request from the nonvolatile memory, decodes the first data, and then when decoding of the first data is successful, the controller transmits the decoded first data to the host device,
    when decoding of the first data fails, the controller transmits the command, reads second data corresponding to the read request from the nonvolatile memory using the optimum read voltage determined through the second threshold voltage tracking operation, decodes the second data, and then when decoding of the second data is successful, transmits the decoded second data to the host device.

7. The memory system according to claim 6, wherein the controller stores a read voltage used to read the first data, and updates the stored read voltage with the optimum read voltage determined through the second threshold voltage tracking operation.

8. The memory system according to claim 7, wherein when the search result indicates that a read voltage could not be calculated, the controller performs the first threshold voltage tracking operation by transmitting multiple read requests to the nonvolatile memory, reads the data corresponding to the read request from the nonvolatile memory using the optimum read voltage determined through the first threshold voltage tracking operation, decodes third data using the optimum read voltage determined through the first threshold voltage tracking operation by the controller, and then when decoding of the third data is successful, transmits the decoded third data to the host device.

9. The memory system according to claim 1, wherein the memory system is connectable to a host device, and
the controller is configured to read data stored in the nonvolatile memory using a physical address in response to a read request from the host device, the physical address being mapped to a logical address specified by the read request.

10. The memory system according to claim 1, wherein the nonvolatile memory includes a plurality of blocks, each of which is a data erasure unit and includes word lines and memory cells connected to the word lines, and
when receiving the transmitted response from the nonvolatile memory, the controller determines whether to store data stored in a first block including the plurality of memory cells connected to the word line, in a second block, based on the received response.

11. The memory system according to claim 10, wherein the controller is configured to calculate a first difference that is a difference between the optimum read voltage determined through the second threshold voltage tracking operation and a preset read voltage, and store the data stored in the first block in the second block when the first difference is larger than a first value.

12. The memory system according to claim 10, wherein when the search result indicates that the optimum read voltage was not calculated, the controller performs the first threshold voltage tracking operation by transmitting multiple read requests to the nonvolatile memory, calculates a second difference that is a difference between the optimum read voltage determined through the first threshold voltage tracking operation by the controller and the preset read voltage, and saves the data stored in the first block in the second block when the second difference is larger than a predetermined second value.

13. The memory system according to claim 1, wherein
the command specifies a minimum voltage value and a change read voltage from a minimum voltage value, and
the nonvolatile memory is configured to search the optimum read voltage using the minimum voltage value and the change read voltage.

14. The memory system according to claim 1, wherein the memory system is connectable to a host device, and
the controller is configured to read data stored in the nonvolatile memory using a physical address in response to a read request from the host device, the physical address being mapped to a logical address specified by the read request.

* * * * *